United States Patent
Dordi et al.

(10) Patent No.: US 6,267,853 B1
(45) Date of Patent: Jul. 31, 2001

(54) ELECTRO-CHEMICAL DEPOSITION SYSTEM

(75) Inventors: Yezdi Dordi, Palo Alto; Muhammad Atif Malik, Santa Clara; Henan Hao, Fremont; Timothy H. Franklin; Joe Stevens, both of San Jose; Donald Olgado, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,210

(22) Filed: Jul. 9, 1999

(51) Int. Cl.⁷ .................................................. C25B 15/00
(52) U.S. Cl. ..................... 204/232; 204/237; 204/238; 204/240; 204/267; 204/276; 204/286.1; 204/287; 204/297.01; 204/297.03; 204/297.08
(58) Field of Search .................................. 204/232, 237, 204/238, 240, 267, 286.1, 287, 297.01, 297.03, 297.08, 276

(56) References Cited

U.S. PATENT DOCUMENTS

| | | | |
|---|---|---|---|
| 3,649,509 | 3/1972 | Morawetz et al. | 204/238 |
| 3,727,620 | 4/1973 | Orr | 134/95 |

(List continued on next page.)

FOREIGN PATENT DOCUMENTS

| | | |
|---|---|---|
| 58182823 | 10/1983 | (JP) . |
| 63118093 | 5/1988 | (JP) . |
| 04131395 | 5/1992 | (JP) . |
| 04280993 | 10/1992 | (JP) . |
| 6017291 | 1/1994 | (JP) . |
| WO 97/12079 | 4/1997 | (WO) . |
| WO 99/25902 | 5/1999 | (WO) . |
| WO 99/25903 | 5/1999 | (WO) . |
| WO 99/25904 | 5/1999 | (WO) . |
| WO 99/25905 | 5/1999 | (WO) . |
| WO 99/26275 | 5/1999 | (WO) . |

OTHER PUBLICATIONS

PCT Written Opinion citing additional references for PCT/US99/28159, dated Dec. 8, 2000.
PCT International Search Report dated Feb. 7, 2000.

(List continued on next page.)

Primary Examiner—Bruce F. Bell
(74) Attorney, Agent, or Firm—Thomason, Moser & Patterson LLP

(57) ABSTRACT

The present invention provides an electro-chemical deposition system that is designed with a flexible architecture that is expandable to accommodate future designs and gap fill requirements and provides satisfactory throughput to meet the demands of other processing systems. The electro-chemical deposition system generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electro-chemical deposition system includes an edge bead removal/spin-rinse-dry (EBR/SRD) station disposed on the mainframe adjacent the loading station, a rapid thermal anneal chamber attached to the loading station, a seed layer repair station disposed on the mainframe, and a system controller for controlling the electro-chemical deposition process and the components of the electro-chemical deposition system.

10 Claims, 16 Drawing Sheets

U.S. PATENT DOCUMENTS

| | | | |
|---|---|---|---|
| 3,770,598 | 11/1973 | Creutz | 204/52 R |
| 4,027,686 | 6/1977 | Shortes et al. | 134/33 |
| 4,092,176 | 5/1978 | Kozai et al. | 134/186 |
| 4,110,176 | 8/1978 | Creutz et al. | 204/52 R |
| 4,113,492 | 9/1978 | Sato et al. | 96/67 |
| 4,315,059 | 2/1982 | Raistrick et al. | 429/112 |
| 4,326,940 | 4/1982 | Eckles et al. | 204/232 |
| 4,336,114 | 6/1982 | Mayer et al. | 204/52 R |
| 4,376,685 | 3/1983 | Watson | 204/52 R |
| 4,405,416 | 9/1983 | Raistrick et al. | 204/68 |
| 4,428,815 | 1/1984 | Powell et al. | 204/297 W |
| 4,435,266 | 3/1984 | Johnston | 204/276 |
| 4,489,740 | 12/1984 | Rattan et al. | 134/140 |
| 4,510,176 | 4/1985 | Cuthbert et al. | 427/82 |
| 4,518,678 | 5/1985 | Allen | 430/311 |
| 4,519,846 | 5/1985 | Aigo | 134/15 |
| 4,732,785 | 3/1988 | Brewer | 427/240 |
| 4,789,445 | 12/1988 | Goffman et al. | 204/114 |
| 5,039,381 | 8/1991 | Mullarkey | 204/47.5 |
| 5,055,425 | 10/1991 | Leibovitz et al. | 437/195 |
| 5,092,975 | 3/1992 | Yamamura et al. | 204/198 |
| 5,155,336 | 10/1992 | Gronet et al. | 219/411 |
| 5,162,260 | 11/1992 | Leibovitz et al. | 437/195 |
| 5,222,310 | 6/1993 | Thompson et al. | 34/202 |
| 5,224,504 | 7/1993 | Thompson et al. | 134/155 |
| 5,230,743 | 7/1993 | Thompson et al. | 134/32 |
| 5,252,807 | 10/1993 | Chizinsky | 219/390 |
| 5,256,274 | 10/1993 | Poris | 205/123 |
| 5,259,407 | 11/1993 | Tuchida et al. | 134/151 |
| 5,290,361 | 3/1994 | Hayashida et al. | 134/2 |
| 5,316,974 | 5/1994 | Crank | 437/190 |
| 5,328,589 | 7/1994 | Martin | 205/296 |
| 5,349,978 | 9/1994 | Sago et al. | 134/153 |
| 5,368,711 | 11/1994 | Poris | 204/193 |
| 5,377,708 | 1/1995 | Bergman et al. | 134/105 |
| 5,429,733 | 7/1995 | Ishida | 204/224 R |
| 5,447,615 | 9/1995 | Ishida | 204/224 R |
| 5,516,412 | 5/1996 | Andricacos et al. | 204/224 R |
| 5,608,943 | 3/1997 | Konishi et al. | 15/302 |
| 5,625,170 | 4/1997 | Poris | 177/50 |
| 5,705,223 | 1/1998 | Bunkofske | 427/240 |
| 5,723,028 | 3/1998 | Poris | 204/231 |

OTHER PUBLICATIONS

Lucio Colombo, "Wafer Back Surface Film Removal," Central R&D, SGS–THOMPSON, Microelectronics, Agrate, Italy, 6 pages, No month/yr. available.

Semitool©, Inc., "Metallization & Interconnect," 1998, 4 pages, No month available.

Verteq Online©, "Products Overview," 1996–1998, 5 pages, No month available.

Laurell Technologies Corporation, "Two control configurations available–see WS 400 OR WS–400Lite." Oct. 19, 1998, 6 pages.

Peter Singer, "Tantalum, Copper and Damascene: The Future of Interconnects," Semiconductor International, Jun., 1998, Pages cover, 91–92,94,96 & 98.

Peter Singer, "Wafer Processing," Semiconductor International, Jun., 1998, p. 70.

Kenneth E. Pitney, "NEY Contact Manual," Electrical Contacts for Low Energy Uses, 1973, No month available.

Ragnar Holm, "Electric Contacts Theory and Application," New York, 1967, No month available.

ELECTRO-CHEMICAL DEPOSITION SYSTEM

BACKGROUND OF THE INVENTION

1. Field of the Invention

The present invention generally relates to deposition of a metal layer onto a wafer/substrate. More particularly, the present invention relates to an electro-chemical deposition or electroplating system for forming a metal layer on a wafer/substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration leading to the formation of voids in the conductor.

Copper and its alloys have lower resistivities than aluminum and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 4:1, having 0.35 $\mu$ (or less) wide vias are limited. As a result of these process limitations, plating, which had previously been limited to the fabrication of lines on circuit boards, is just now being used to fill vias and contacts on semiconductor devices.

Metal electroplating is generally known and can be achieved by a variety of techniques. A typical method generally comprises physical vapor depositing a barrier layer over the feature surfaces, physical vapor depositing a conductive metal seed layer, preferably copper, over the barrier layer, and then electroplating a conductive metal over the seed layer to fill the structure/feature. Finally, the deposited layers and the dielectric layers are planarized, such as by chemical mechanical polishing (CMP), to define a conductive interconnect feature.

FIG. 1 is a cross sectional view of a simplified typical fountain plater 10 incorporating contact pins. Generally, the fountain plater 10 includes an electrolyte container 12 having a top opening, a substrate holder 14 disposed above the electrolyte container 12, an anode 16 disposed at a bottom portion of the electrolyte container 12 and a contact ring 20 contacting the substrate 22. A plurality of grooves 24 are formed in the lower surface of the substrate holder 14. A vacuum pump (not shown) is coupled to the substrate holder 14 and communicates with the grooves 24 to create a vacuum condition capable of securing the substrate 22 to the substrate holder 14 during processing. The contact ring 20 comprises a plurality of metallic or semi-metallic contact pins 26 distributed about the peripheral portion of the substrate 22 to define a central substrate plating surface. The plurality of contact pins 26 extend radially inwardly over a narrow perimeter portion of the substrate 22 and contact a conductive seed layer of the substrate 22 at the tips of the contact pins 26. A power supply (not shown) is attached to the pins 26 thereby providing an electrical bias to the substrate 22. The substrate 22 is positioned above the cylindrical electrolyte container 12 and electrolyte flow impinges perpendicularly on the substrate plating surface during operation of the cell 10.

While present day electroplating cells, such as the one shown in FIG. 1, achieve acceptable results on larger scale substrates, a number of obstacles impair consistent reliable electroplating onto substrates having micron-sized, high aspect ratio features. Generally, these obstacles include providing uniform power distribution and current density across the substrate plating surface to form a metal layer having uniform thickness, preventing unwanted edge and backside deposition to control contamination to the substrate being processed as well as subsequent substrates, and maintaining a vacuum condition which secures the substrate to the substrate holder during processing. Also, the present day electroplating cells have not provided satisfactory throughput to meet the demands of other processing systems and are not designed with a flexible architecture that is expandable to accommodate future designs rules and gap fill requirements. Moreover, the current systems have not addressed problems due to insufficient or discontinuous seed layers before the electroplating process. Furthermore, current electroplating system platforms have not provided post electrochemical deposition treatment, such as a rapid thermal anneal treatment, for enhancing deposition results within the same system platform.

One particular problem encountered in current electroplating processes is that the edge of the seed layer receives an excess amount of deposition, typically referred to as an edge bead, during the electroplating process. The wafer has a seed layer deposited thereon and an electroplated layer electrochemically deposited over the seed layer. It has been observed that the edge of the seed layer receives a higher current density than the remainder of the seed layer, resulting in a higher rate of deposition at the edge of the seed layer. The mechanical stress at the edge of the seed layer is also higher than the remainder of the seed layer, causing the deposition at the edge of the seed layer to pull up and away from the edge of the wafer. The excess deposition is typically removed by a CMP process. However, during the CMP process, the excess deposition 36 at the edge of the wafer typically tears off from the edge of the seed layer and may damage the adjacent portion of the wafer. The broken off metal may also damage the devices formed on the wafer. Thus, the number of properly formed devices is decreased and the cost per device formed is increased.

Additionally, current electroplating systems are incapable of performing necessary processing steps without resorting to peripheral components and time intensive efforts. For example, analysis of the processing chemicals is required periodically during the plating process. The analysis determines the composition of the electrolyte to ensure proper proportions of the ingredients. Conventional analysis is performed by extracting a sample of electrolyte from a test port and transferring the sample to a remote analyzer. The electrolyte composition is then manually adjusted according to the results of the analysis. The analysis must be performed frequently because the concentrations of the various chemicals are in constant flux. However, the foregoing method is time consuming and limits the number of analyses which can be performed.

Therefore, there remains a need for an electrochemical deposition system that is designed with a flexible architecture that is expandable to accommodate future designs rules and gap fill requirements and provides satisfactory throughput to meet the demands of other processing systems. Preferably, the apparatus removes the excess deposition at the edge of the wafer without damaging the devices formed on the wafer surface. It would be further desirable for the apparatus to be adaptable for performing a wafer cleaning process after the excess deposition has been removed from the wafer, such as a spin-rinse-dry process. It would be further desirable for the apparatus include a system that extends the reliability of depositions in features by enhancing an initial conductive layer for a subsequent electroplating process. It would also be desirable for the system to include one or more chemical analyzers integrated with the processing system to provide real-time analysis of the electrolyte composition.

SUMMARY OF THE INVENTION

The present invention provides an electrochemical deposition system that is designed with a flexible architecture that is expandable to accommodate future designs and gap fill requirements and provides satisfactory throughput to meet the demands of other processing systems. The electrochemical deposition system generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electro-chemical deposition system includes an edge bead removal/spin-rinse-dry (EBR/SRD) station disposed on the mainframe adjacent the loading station, a rapid thermal anneal chamber attached to the loading station, a seed layer repair station disposed on the mainframe, and a system controller for controlling the electrochemical deposition process and the components of the electrochemical deposition system.

One aspect of the invention provides an apparatus that removes the excess deposition at the edge of the wafer without damaging the devices formed on the wafer surface. The apparatus is adaptable for performing a wafer cleaning process after the excess deposition has been removed from the wafer, such as a spin-rinse-dry process.

Another aspect of the invention provides an apparatus that extends the reliability of depositions in features by enhancing an initial conductive layer for a subsequent electroplating process.

Still another aspect of the invention provides an electrolyte replenishing system having a real-time chemical analyzer module and a dosing module. The chemical analyzer module includes at least one and preferably two analyzers operated by a controller and integrated with a control system of the electro-chemical deposition system. A sample line provides continuous flow of electrolyte from a main electrolyte tank to the chemical analyzer module. A first analyzer determines the concentrations of organic substances in the electrolyte while the second analyzer determines the concentrations of inorganic substances. The dosing module is then activated to deliver the proper proportions of chemicals to the main tank in response to the information obtained by the chemical analyzer module. The real-time, on-line analyzer is preferably disposed in a closed loop system with the electrolyte supply. The analyzer also includes one or more standards and one or more calibration schemes to provide accurate measurements and prolong the useful life of electrodes and sensors used in the analyzer.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
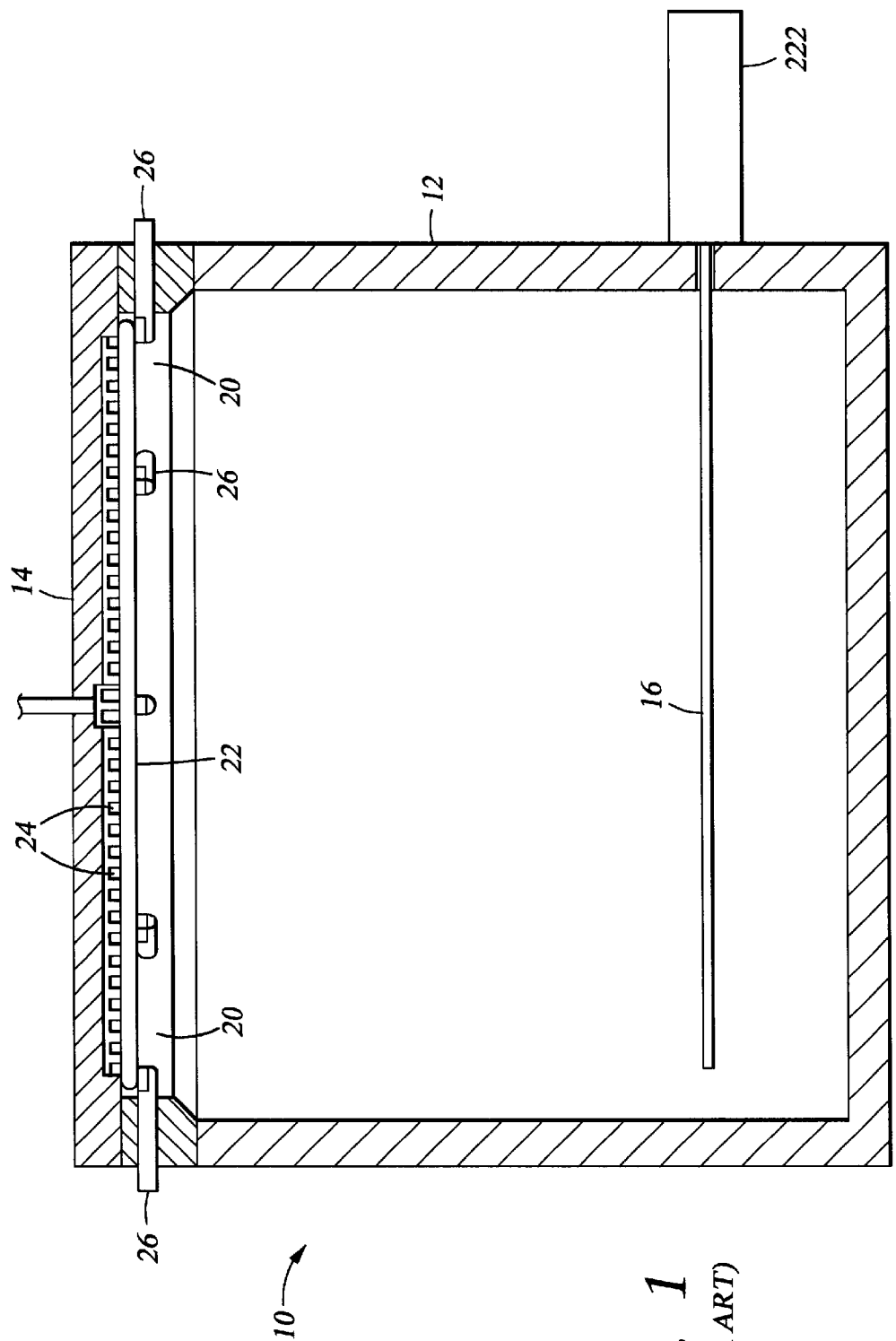
FIG. 1 is a cross sectional view of a simplified typical fountain plater 10 incorporating contact pins.
Figure 2:
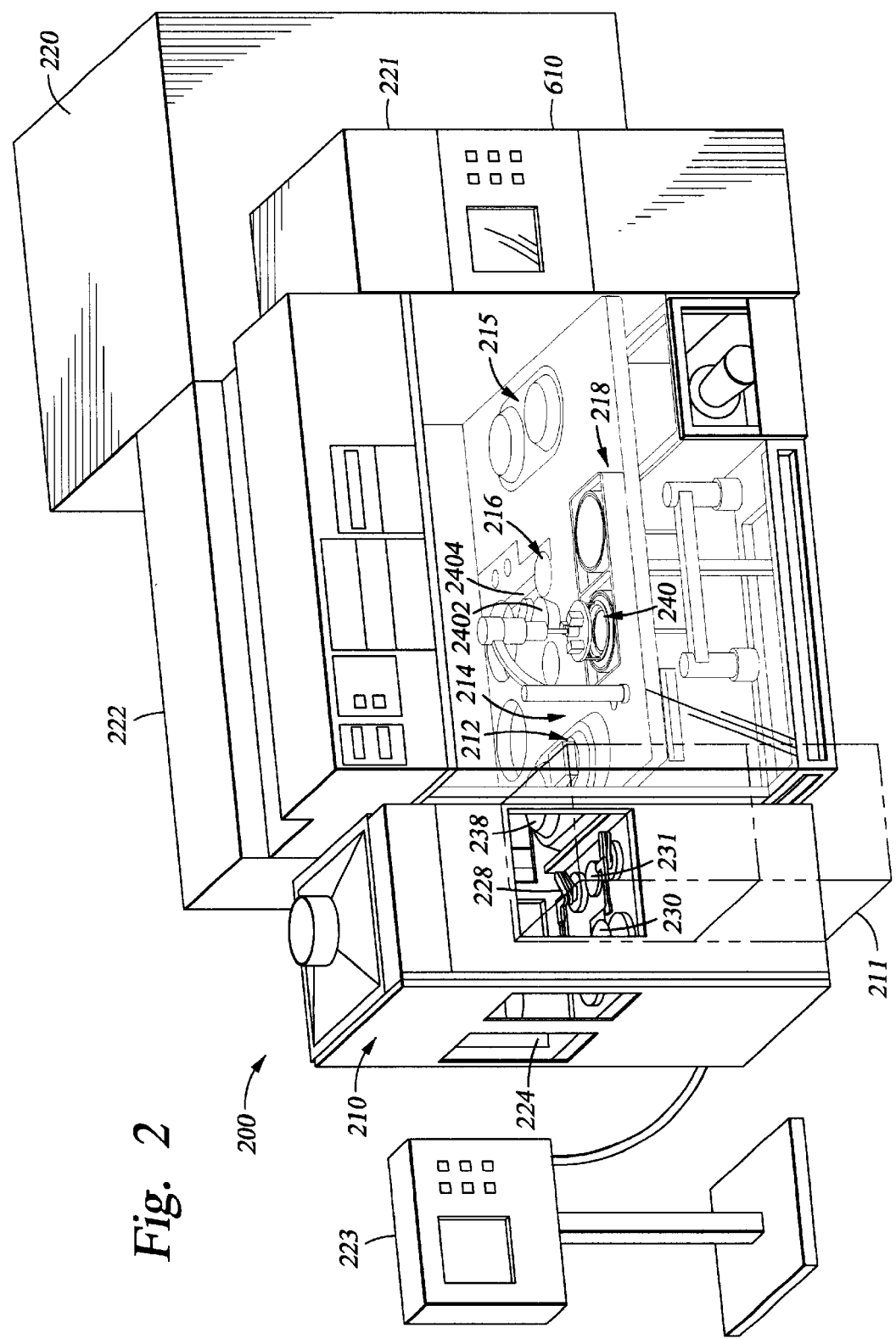
FIG. 2 is a perspective view of an electroplating system platform 200 of the invention.
Figure 3:
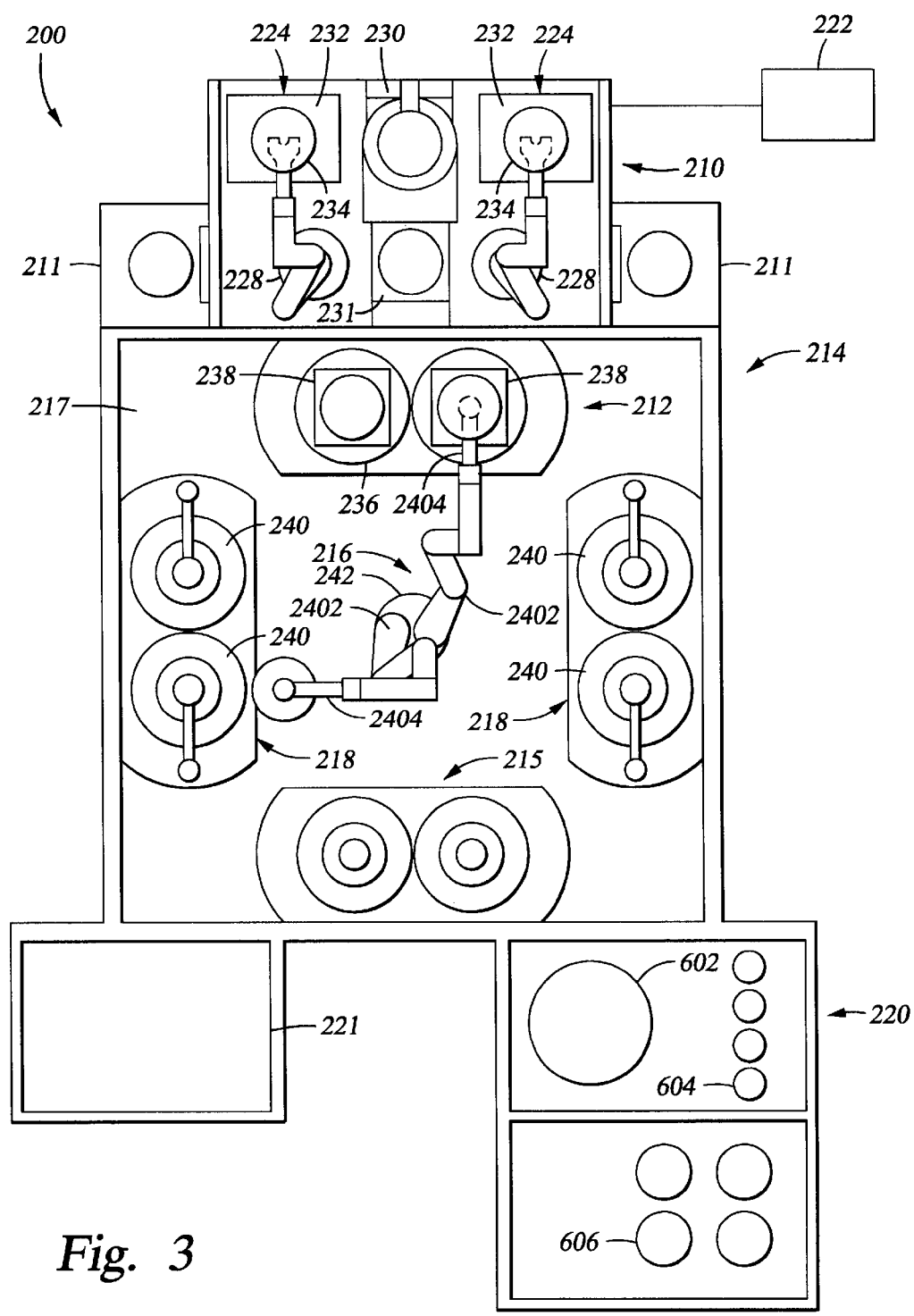
FIG. 3 is a schematic view of an electroplating system platform 200 of the invention.

FIG. 2 is a perspective view of an electroplating system platform 200 of the invention. FIG. 3 is a schematic view of an electroplating system platform 200 of the invention. Referring to both FIGS. 2 and 3, the electroplating system platform 200 generally comprises a loading station 210, a thermal anneal chamber 211, a mainframe 214, and an electrolyte replenishing system 220. The mainframe 214 generally comprises a mainframe transfer station 216, a spin-rinse dry (SRD) station 212, a plurality of processing stations 218, and a seed layer repair station 215. Preferably, the electroplating system platform 200, particularly the mainframe 214, is enclosed in a clean environment using panels such as plexiglass panels. The mainframe 214 includes a base 217 having cut-outs to support various stations needed to complete the electro-chemical deposition process. The base 217 is preferably made of aluminum, stainless steel or other rigid materials that can support the various stations disposed thereon. A chemical protection coating, such as Halar™, ethylene-chloro-tri-fluoro-ethaylene (ECTFE), or other protective coatings, is preferably disposed over the surfaces of the base 217 that are exposed to potential chemical corrosion. Preferably, the protective coating provides good conformal coverage over the metal base 217, adheres well to the metal base 217, provides good ductility, and resists cracking under normal operating conditions of the system. Each processing station 218 includes one or more processing cells 240. An electrolyte replenishing system 220 is positioned adjacent the mainframe 214 and connected to the process cells 240 individually to circulate electrolyte used for the electroplating process. The electroplating system platform 200 also includes a power supply station 221 for providing electrical power to the system and a control system 222, typically comprising a programmable microprocessor.

The loading station 210 preferably includes one or more wafer cassette receiving areas 224, one or more loading station transfer robots 228 and at least one wafer orientor 230. The number of wafer cassette receiving areas, loading station transfer robots 228 and wafer orientor included in the loading station 210 can be configured according to the desired throughput of the system. As shown for one embodiment in FIGS. 2 and 3, the loading station 210 includes two wafer cassette receiving areas 224, two loading station transfer robots 228 and one wafer orientor 230. A wafer cassette 232 containing wafers 234 is loaded onto the wafer cassette receiving area 224 to introduce wafers 234 into the electroplating system platform. The loading station transfer robot 228 transfers wafers 234 between the wafer cassette 232 and the wafer orientor 230. The loading station transfer robot 228 comprises a typical transfer robot commonly known in the art. The wafer orientor 230 positions each wafer 234 in a desired orientation to ensure that the wafer is properly processed. The loading station transfer robot 228 also transfers wafers 234 between the loading station 210 and the SRD station 212 and between the loading station 210 and the thermal anneal chamber 211. The loading station 210 preferably also includes a wafer cassette 231 for temporary storage of wafers as needed to facilitate efficient transfer of wafers through the system.

Figure 4:
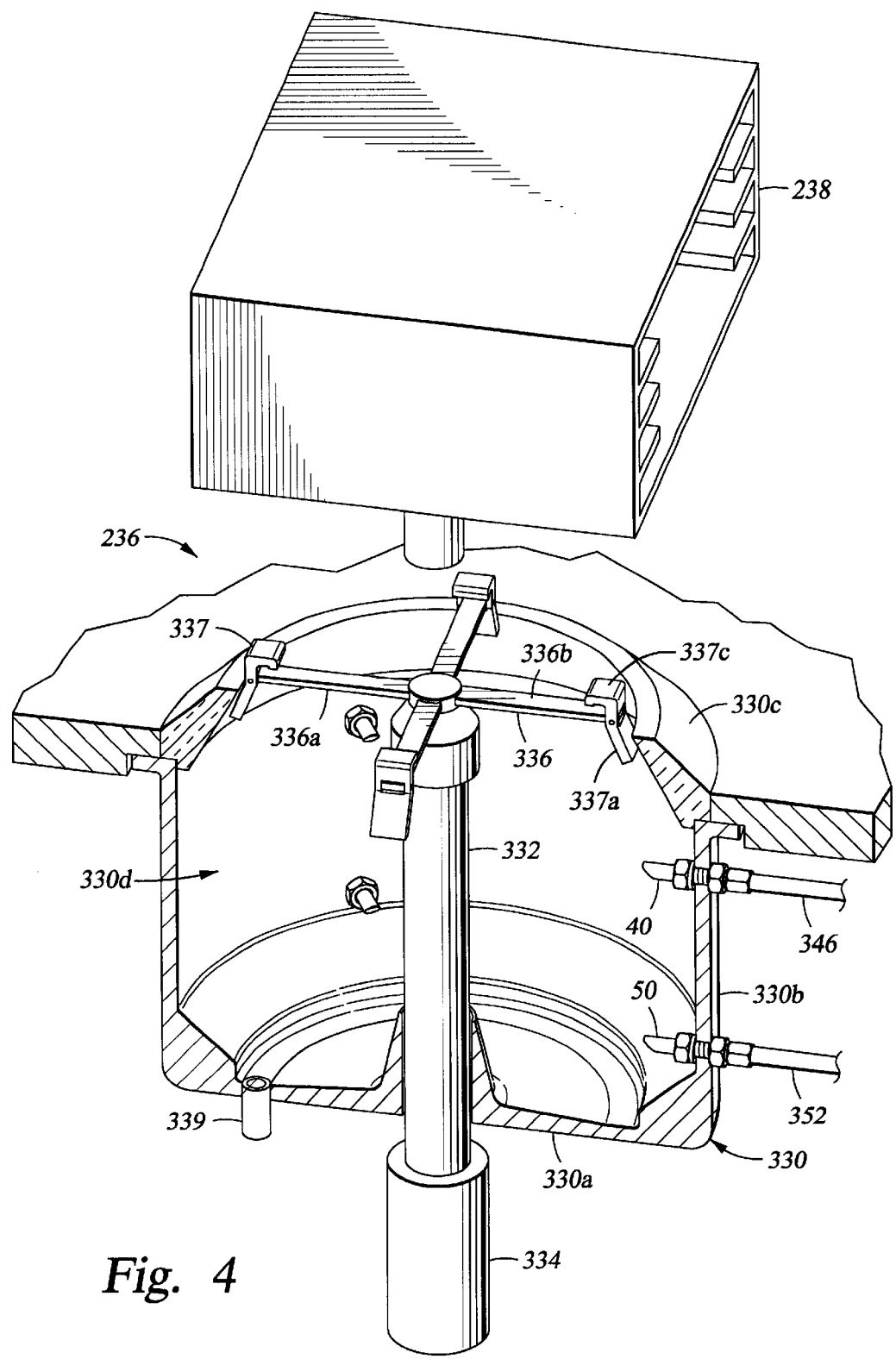
FIG. 4 is a schematic perspective view of a spin-rinse-dry (SRD) module of the present invention, incorporating rinsing and dissolving fluid inlets.
Figure 5:
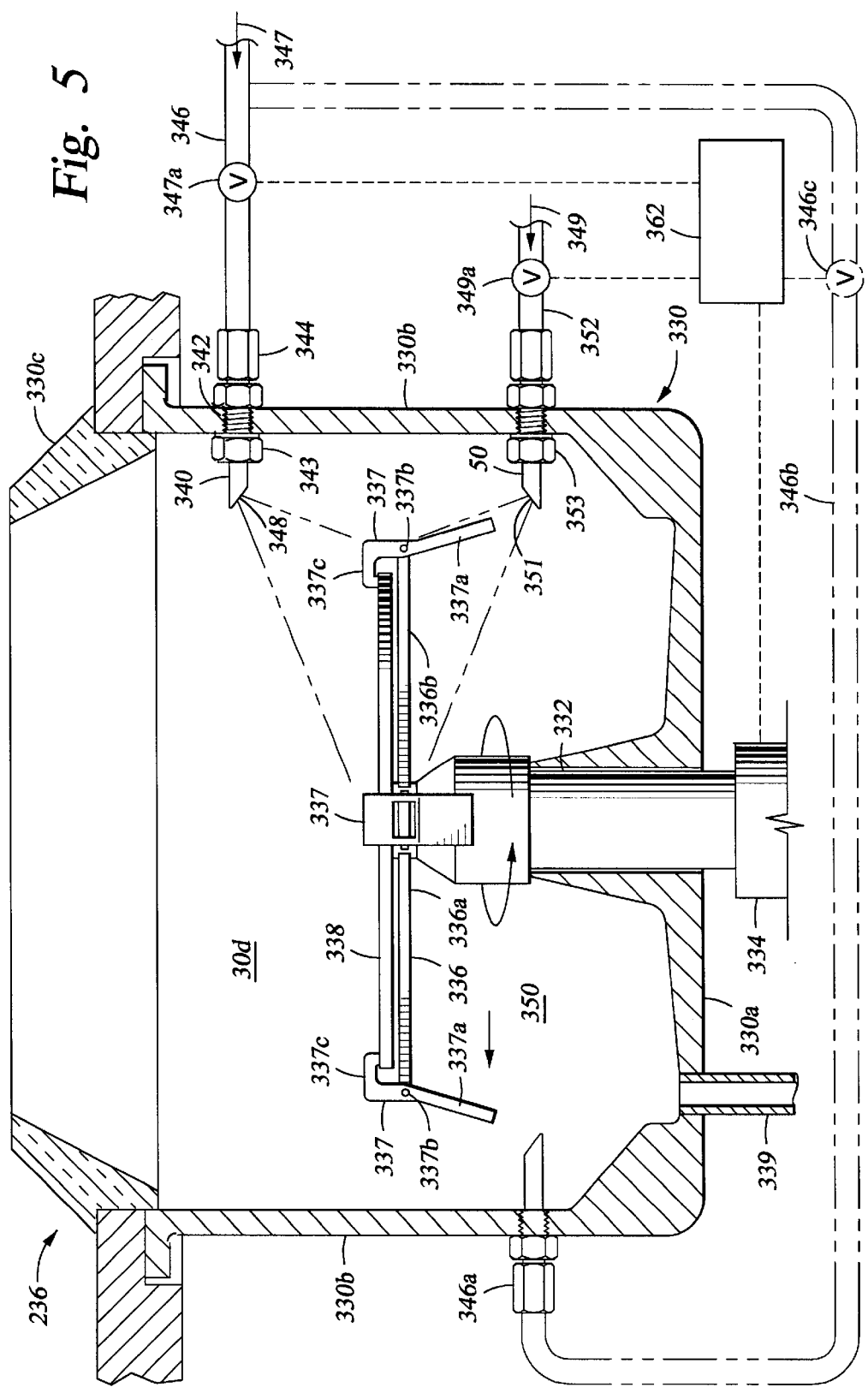
FIG. 5 is a side cross sectional view of the spin-rinse-dry (SRD) module of FIG. 4 and shows a substrate in a processing position vertically disposed between fluid inlets.

FIG. 4 is a schematic perspective view of a spin-rinse-dry (SRD) module of the present invention, incorporating rinsing and dissolving fluid inlets. FIG. 5 is a side cross sectional view of the spin-rinse-dry (SRD) module of FIG. 4 and shows a substrate in a processing position vertically disposed between fluid inlets. Preferably, the SRD station 212 includes one or more SRD modules 236 and one or more wafer pass-through cassettes 238. Preferably, the SRD station 212 includes two SRD modules 236 corresponding to the number of loading station transfer robots 228, and a wafer pass-through cassette 238 is positioned above each SRD module 236. The wafer pass-through cassette 238 facilitates wafer transfer between the loading station 210 and the mainframe 214. The wafer pass-through cassette 238 provides access to and from both the loading station transfer robot 228 and a robot in the mainframe transfer station 216.

Referring to FIGS. 4 and 5, the SRD module 236 comprises a bottom 330a and a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338 (shown in FIG. 5) on the pedestal upper surface during processing. The pedestal actuator 334 rotates the pedestal to spin the substrate and raises and lowers the pedestal as described below. The substrate may be held in place on the pedestal by a plurality of clamps 337. The clamps pivot with centrifugal force and engage the substrate preferably in the edge exclusion zone of the substrate. In a preferred embodiment, the clamps engage the substrate only when the substrate lifts off the pedestal during the processing. Vacuum passages (not shown) may also be used as well as other holding elements. The pedestal has a plurality of pedestal arms 336a and 336b, so that the fluid through the second nozzle may impact as much surface area on the lower surface of the substrate as is practical. An outlet 339 allows fluid to be removed from the SRD module. The terms "below", "above", "bottom", "top", "up", "down", "upper", and "lower" and other positional terms used herein are shown with respect to the embodiments in the figures and may be varied depending on the relative orientation of the processing apparatus.

A first conduit 346, through which a first fluid 347 flows, is connected to a valve 347a. The conduit may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 362. The conduit 346 connects to a first fluid inlet 340 that is located above the substrate and includes a mounting portion 342 to attach to the SRD module and a connecting portion 344 to attach to the conduit 346. The first fluid inlet is shown with a single first nozzle 348 to deliver a first fluid 347 under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module at a variety of positions. For instance, if the flow is desired to be a certain angle that is directed back toward the SRD module periphery along the edge of the substrate, the nozzles could be extended radially inward and the discharge from the nozzles be directed back toward the SRI module periphery.

The controller 362 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c, which may be used to flow a rinsing fluid on the backside of the substrate after the dissolving fluid is flown without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot (not shown) places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm wafer.

The invention could also be used to remove the unwanted deposits along the edge of the substrate to create an edge exclusion zone. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process of the present invention described above.

Figure 14:
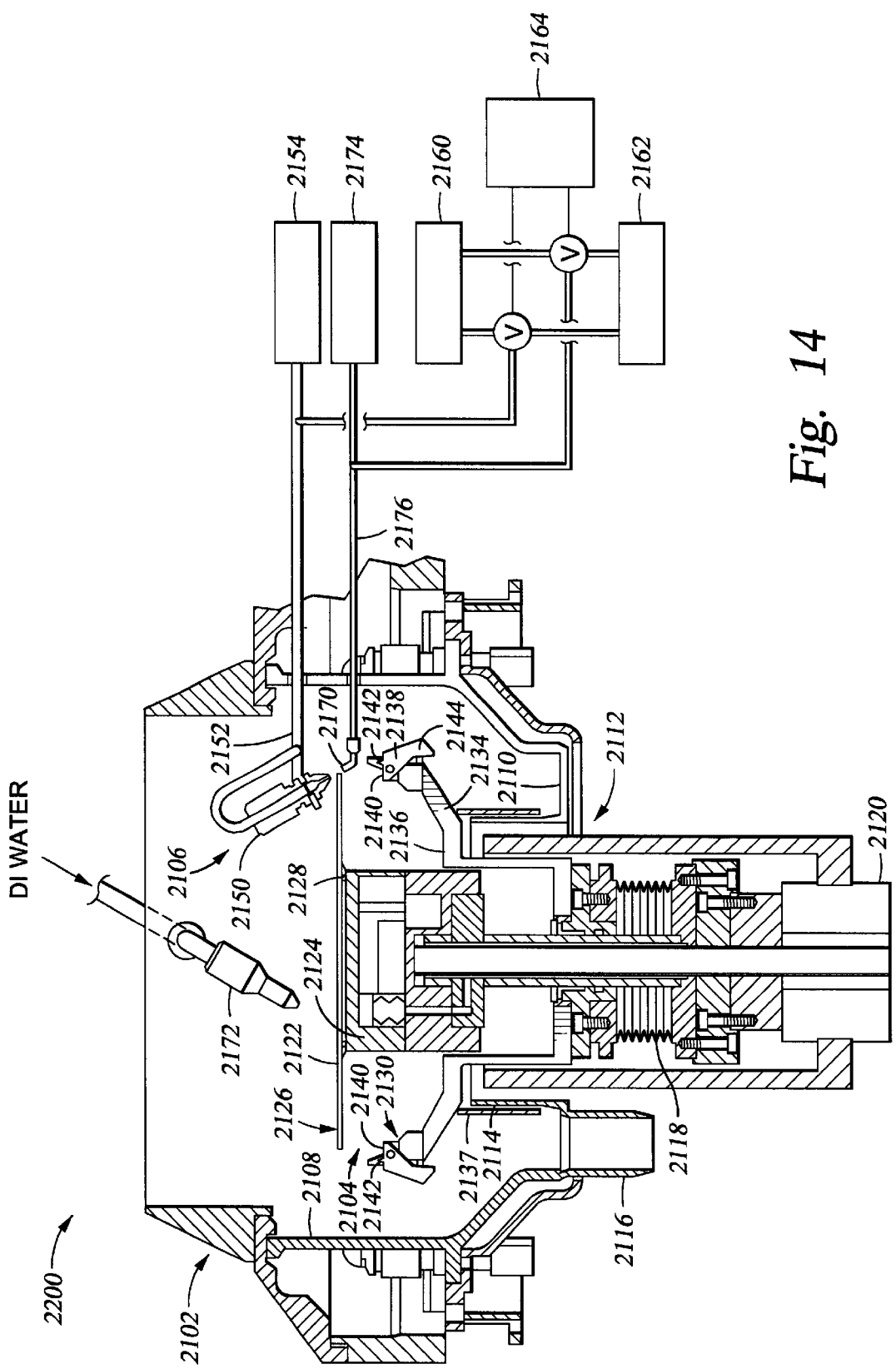
FIG. 14 is a cross sectional view of a combined edge bead removal/spin-rinse-dry (EBRISRD) module showing a substrate in a processing position vertically disposed between fluid inlets.

FIG. 14 is a cross sectional view of a combined edge bead removal/spin-rinse-dry (EBR/SRD) module showing a substrate in a processing position vertically disposed between fluid inlets. This embodiment of the invention is useful for both edge bead removal (EBR) and spin-rinse-dry (SRD) processes. The EBR/SRD module is preferably disposed in the SRD station 212 (see FIG. 3). The EBR/SRD module 2200 comprises a container 2102, a wafer holder assembly 2104 and a fluid/chemical delivery assembly 2106. The container 2102 preferably includes a cylindrical sidewall 2108, a container bottom 2110 having a central opening 2112, and an upturned inner wall 2114 extending upwardly from the peripheral edge of the central opening 2112. A fluid outlet 2116 is connected to the container bottom 2110 to facilitate draining of the used fluids and chemicals from the EBR/SRD module 2200.

The wafer holder assembly 2104 is disposed above the central opening 2112 and includes a lift assembly 2118 and a rotation assembly 2120 that extends through the central opening 2112. The lift assembly 2118 preferably comprises a bellows-type lift or a lead-screw stepper motor type lift assembly, which are well known in the art and commercially available. The lift assembly 2118 facilitates transfer and positioning of the wafer 2122 on the wafer holder assembly 2104 between various vertical positions. The rotation assembly 2120 preferably comprises a rotary motor that is attached below the lift assembly. The rotation assembly 2120 rotates the wafer 2122 during the edge bead removal process.

The wafer holder assembly 2104 preferably comprises a vacuum chuck 2124 that secures a wafer 2122 from the wafer backside and does not obstruct the wafer edge 2126. Preferably, an annular seal 2128, such as a compressible O-ring, is disposed at a peripheral portion of the vacuum chuck surface to seal the vacuum chuck 2124 from the fluids and chemicals used during the edge bead removal process. The wafer holder assembly 2104 preferably includes a wafer lift 2130 that facilitates transfer of a wafer from a robot blade of a transfer robot onto the wafer holder assembly 2104. The wafer lift 2130, as shown in FIG. 14, comprises a spider clip assembly that also can be used to secure a wafer during a spin-rinse-dry process. The spider clip assembly comprises a plurality of arms 2134 extending from an annular base 2136 and a spider clip 2138 pivotally disposed at the distal end of the arm 2134. The annular base 2136 includes a downwardly extending wall 2137 that overlaps the upturned inner wall 2114 to contain fluids used during processing inside the container 2102. The spider clip 2138 includes an upper surface 2140 for receiving the wafer, a clamp portion 2142 for clamping the wafer, and a lower portion 2144 that causes the clamp portion 2142 to engage the edge of the wafer due to centrifugal force when the wafer holder assembly is rotated. Alternatively, the wafer lift 2130 comprises commonly used wafer lifts in various wafer processing apparatus, such as a set of lift pins or a lift hoop disposed on a lift platform or lift ring in or around the vacuum chuck body.

The fluid/chemical delivery assembly 2106 comprises one or more nozzles 2150 disposed on one or more dispense arms 2152. The dispense arm 2152 extends through the container sidewall 2108 and is attached to an actuator 2154 that extends and retracts to vary the position of the nozzle 2150 over the substrate 2122. By having an extendable dispense arm 2152, the nozzle can be positioned over the wafer to point the nozzle from an interior portion of the wafer toward the edge of the wafer, which enhances the control over the delivery of the etchant/fluids to the wafer edge. Alternatively, the dispense arm 2152 is fixedly attached to the container sidewall 2108, and the nozzle 2150 is secured to the dispense arm in a position that does not interfere with vertical wafer movement in the container 2102.

Preferably, the dispense arm 2152 includes one or more conduits extending through the dispense arm for connecting the nozzle 2150 to an etchant source. A variety of etchants are well known in the art for removing deposited metal from a substrate, such as nitric acid and other acids available commercially. Alternatively, the nozzle 2150 is connected through a flexible tubing disposed through the conduit in the dispense arm 2152. The nozzles 2150 can be selectively connected to one or more chemical/fluid sources, such as a deionized water source 2160 and an etchant source 2162, and a computer control 2164 switches the connection between the one or more fluid/chemical sources according to a desired program. Alternatively, a first set of nozzles are connected to the deionized water source and a second set of nozzles are connected to the etchant source, and the nozzles are selectively activated to provide fluids to the wafer.

Preferably, an additional set of lower nozzles 2170 are disposed at a position below the wafer, preferably vertically aligned correspondingly to the positions of nozzles 2150. The lower nozzles 2170 are selectively connected to a deionized water source 2160 and an etchant source 2162, and the fluid delivered by the nozzles 2170 is controlled by the controller 2164. Preferably, the nozzles 2170 are directed to deliver fluids to a peripheral portion of the backside of the wafer. The lower nozzles 2170 are preferably disposed at positions that do not interfere with the movement of the wafer lift 2130. The lower nozzle 2170 can also be attached to an actuator 2174 through an arm 2176 that retracts and extends to position the nozzles 2170 at desired locations. Alternatively, the wafer lift 2130 is not rotated during processing to prevent interference with the lower nozzles 2170. The EBR/SRD module 2200 preferably also include a dedicated deionized water nozzle 2172 disposed to deliver deionized water to a central portion of the upper surface of the wafer.

Figure 15:
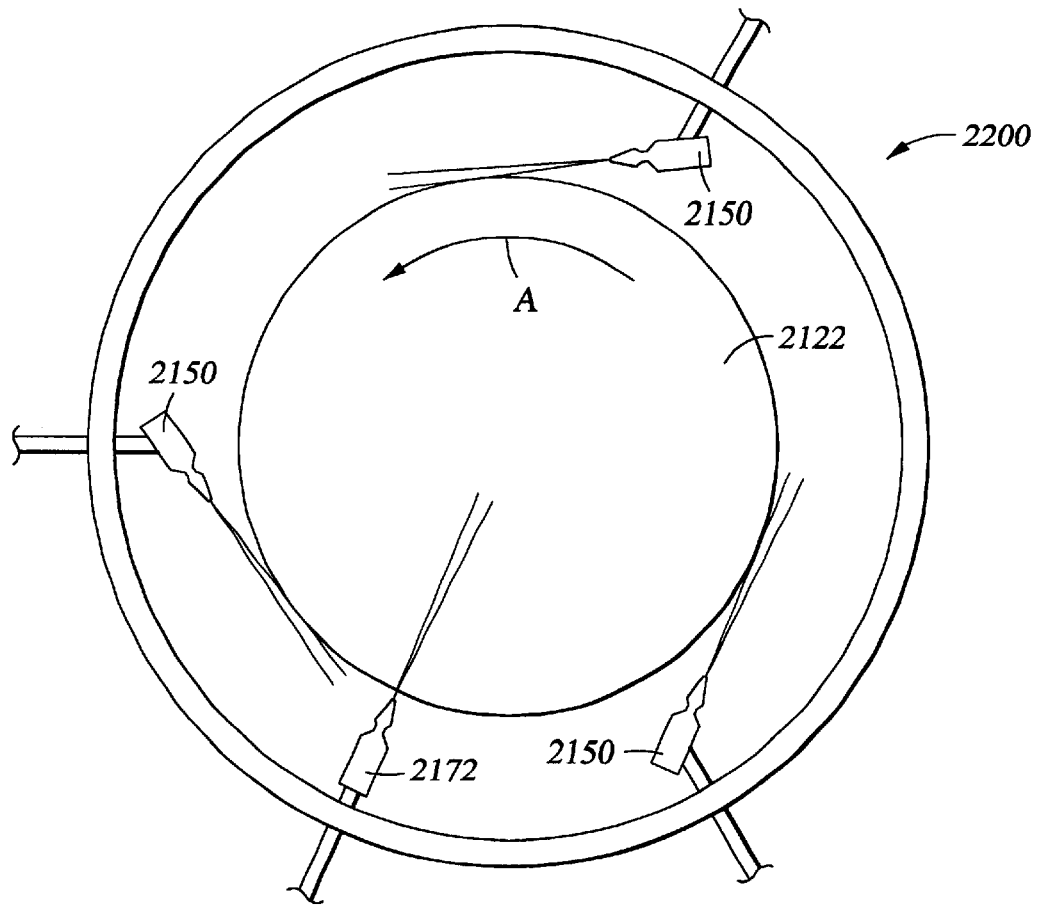
FIG. 15 is a top schematic view of an EBR/SRD module illustrating one embodiment of the nozzle positions for edge bead removal.
Figure 16:
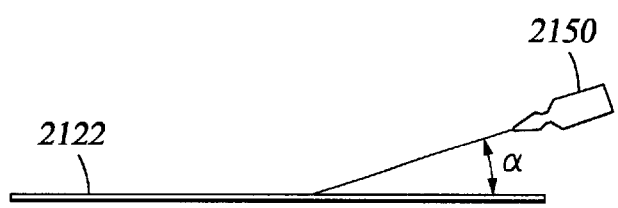
FIG. 16 is a side view of a nozzle 2150 disposed in relation to a wafer 2122 being processed.

Preferably, the nozzles 2150 are disposed at an angled to provide fluids near a peripheral portion of the wafer at a substantially tangential direction. FIG. 15 is a top schematic view of an EBR/SRD module illustrating one embodiment of the nozzle positions for edge bead removal. As shown, three nozzles 2150 are disposed substantially evenly spaced about an interior surface of the container sidewall 2108. Each nozzle 2150 is disposed to provide fluids to an edge portion of the wafer and is positioned to provide sufficient space to allow vertical wafer movement between a processing position and a transfer position. Preferably, the fluid delivery or spray pattern is controlled by the shape of the nozzle and the fluid pressure to limit fluid delivery to a selected edge exclusion range. For example, the etchant is restricted to an outer 3 mm annular portion of the wafer to achieve 3 mm edge exclusion. The nozzles are positioned to provide the etchant at an angle of incidence to the surface of the wafer that controls splashing of the etchant as the etchant comes into contact with the wafer. FIG. 16 is a side view of a nozzle 2150 disposed in relation to a wafer 2122 being processed. Preferably, the angle of incidence, $\alpha$, of the etchant to the wafer is between about 0 degrees and about 45 degrees, more preferably between about 10 degrees and about 30 degrees.

The wafer 2122 is rotated during the edge bead removal process to provide substantially equal exposure to the etchant at the peripheral portion of the wafer. Preferably, the wafer 2122 is rotated in the same direction as the direction of the etchant spray pattern to facilitate controlled edge bead removal. For example, as shown in FIG. 15, the wafer is rotated in a counter-clockwise direction (arrow A) which corresponds to the counter-clockwise spray pattern. The wafer is preferably rotated between about 100 rpm to about 1000 rpm, more preferably between about 500 rpm and about 700 rpm. The effective etch rate (ie., the amount of copper removed divided by the time required for removal) is a function of the etch rate of the etchant, the velocity of the etchant contacting the wafer edge, the temperature of the etchant, and the velocity of the wafer rotation. These parameters can be varied to achieve particular desired results.

In operation, a wafer 2122 is positioned above the wafer holder assembly 2104 of the EBR/SRD module 2200, and the wafer lift 2130 lifts the wafer off of a transfer robot blade. The robot blade retracts and the wafer lift 2130 lowers the wafer onto the vacuum chuck 2124. The vacuum system is activated to secure the wafer 2122 thereon, and the wafer holder assembly 2104 with the wafer disposed thereon is rotated as the nozzles 2150 deliver the etchant onto the peripheral portion of the wafer 2122. Preferably, the lower nozzles 2170 also deliver etchant to the backside of the wafer during the edge bead removal process. Preferably, the deionized water nozzle 2172 delivers deionized water to the central portion of the wafer during the edge bead removal process to prevent unintended etching by the etchant that has splashed onto a central portion of the wafer surface. The etching process is performed for a pre-determined time period sufficient to remove the excess deposition on the wafer edge (ie., edge bead). The wafer is preferably cleaned utilizing deionized water in a spin-rinse-dry process. The spin-rinse-dry process typically involves delivering deionized water to the wafer to rinse residual etchant from the wafer and spining the wafer at a high speed to dry the wafer. For a spin-rinse-dry process, preferably all of the nozzles 2150, 2170 and 2172 delivers deionized water to rinse the wafer as the wafer rotates. After the wafer has been rinsed, the wafer is spun dry and transferred out of the EBRISRD module 2200 for further processing.

The EBR/SRD module 220 or the SRD module 238 is disposed adjacent the loading station 210 and serves as the connection between the loading station 210 and the mainframe 214. Referring back to FIGS. 2 and 3, the mainframe 214, as shown, includes two processing stations 218 disposed on opposite sides, each processing station 218 having two processing cells 240. The mainframe transfer station 216 includes a mainframe transfer robot 242 disposed centrally to provide substrate transfer between various stations on the mainframe. Preferably, the mainframe transfer robot 242 comprises a plurality of individual robot arms 2402 that provides independent access of wafers in the processing stations 218 the SRD stations 212, the seed layer repair stations, and other processing stations disposed on or in connection with the mainframe. As shown in FIG. 3, the mainframe transfer robot 242 comprises two robot arms 2402, corresponding to the number of processing cells 240 per processing station 218. Each robot arm 2402 includes an end effector 2404 for holding a wafer during a wafer transfer. Preferably, each robot arm 2402 is operable independently of the other arm to facilitate independent transfers of wafers in the system. Alternatively, the robot arms 2402 operate in a linked fashion such that one robot extends as the other robot arm retracts.

FIG. 3 is a top schematic view of a mainframe transfer robot having a flipper robot incorporated therein. The mainframe transfer robot 242 as shown in FIG. 3 serves to transfer wafers between different stations attached the mainframe station, including the processing stations and the SRD stations. The mainframe transfer robot 242 includes a plurality of robot arms 2402 (two shown), and a flipper robot 2404 is attached as an end effector for each of the robot arms 2402. Flipper robots are generally known in the art and can be attached as end effectors for wafer handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation For example, the flipper robot flips the substrate processing surface face-down for the electroplating process in the processing cell 240 and flips the substrate processing surface face-up for other processes, such as the spin-rinse-dry process. Preferably, the mainframe transfer robot 242 provides independent robot motion along the X-Y-Z axes by the robot arm 2402 and independent substrate flipping rotation by the flipper robot end effector 2404.

Preferably, one or more electroless deposition cells or modules are disposed in the seed layer repair station 215. The electroless deposition cells, herein referred to as an electroless deposition processing (EDP) cell, perform an electroless deposition process. The EDP cell can be located at the rearward portions, distal from the entry of the substrates, of the electroplating system platform 200. In the embodiment shown, two EDP cells can be arranged side-by-side for greater throughput rates.

Figure 17:
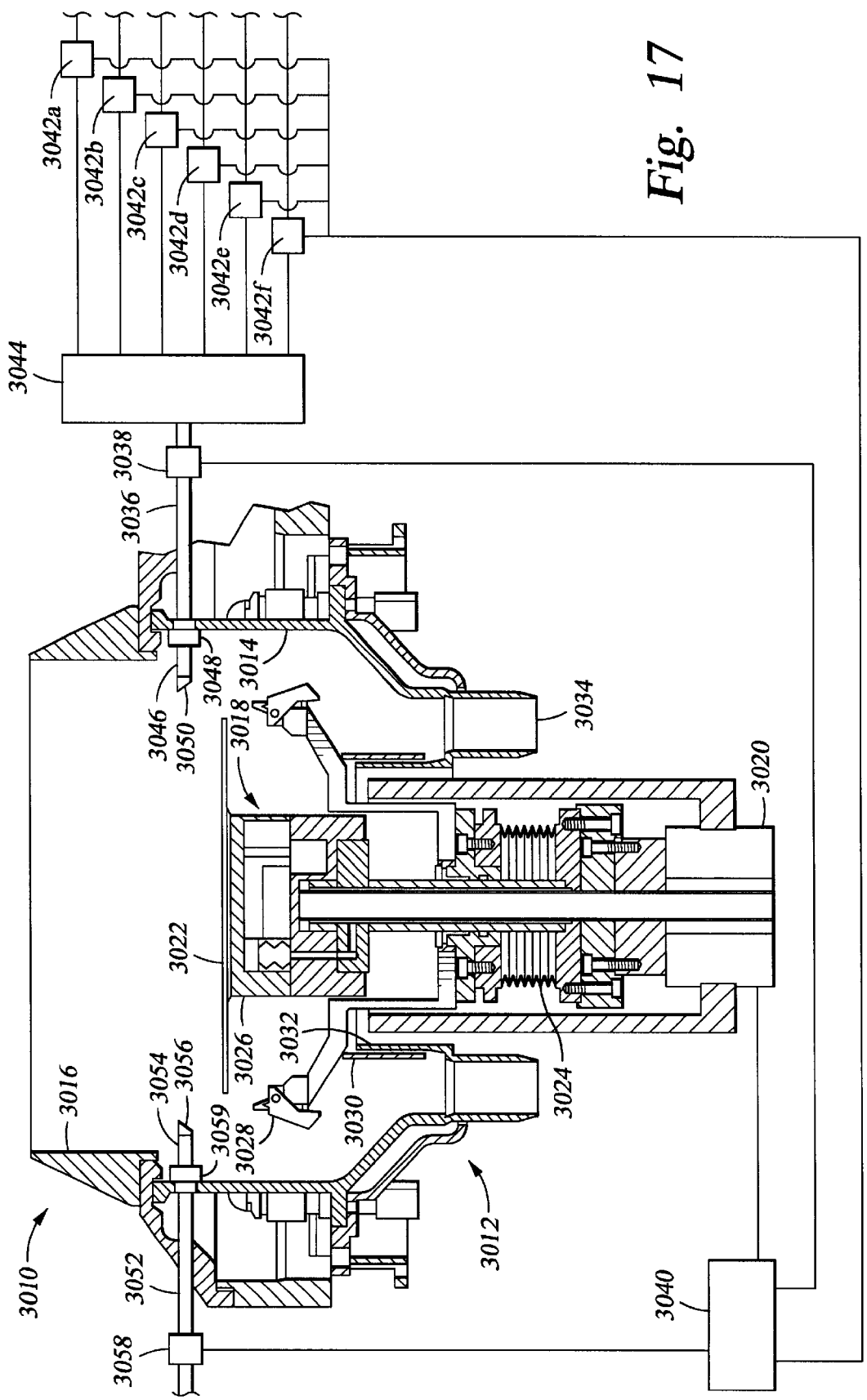
FIG. 17 is a cross section view of an electroless deposition processing (EDP) cell.

FIG. 17 is a schematic cross sectional view of one EDP cell 3010. The EDP cell 3010 includes a bottom 3012, a sidewall 3014, and an angularly disposed upper shield 3016 attached to the sidewall 3014 and open in the middle of the shield. Alternatively, a removable cover (not shown) could be used. A pedestal 3018 is generally disposed in a central location of the cell 3010 and includes a pedestal actuator 3020. The pedestal actuator 3020 rotates the pedestal 3018 to spin a substrate 3022 mounted thereon between about 10 to about 2000 RPMs. The pedestal can be heated so that the substrate temperature is between about 15° C. to about 100° C., and preferably about 60° C. A pedestal lift 3024 raises and lowers the pedestal 3018. The substrate 3022 can be held in position by a vacuum chuck 3026 mounted to the top of the pedestal 3018. In addition, the pedestal 3018 can lower the substrate 3022 to a vertical position aligned with a plurality of clamps 3028. The clamps 3028 pivot with centrifugal force and engage the substrate 3022 preferably on an edge of the substrate. The pedestal 3018 also includes a downwardly disposed annular shield 3030 of greater diameter than a corresponding upwardly disposed annular shield 3032 coupled to the bottom of the cell 3010. The interaction of the two annular shields 3030, 3032 protects the pedestal 3018 and associated components from the fluids in the cell 3010. At least one fluid outlet 3034 is disposed in the bottom of the 3010 cell to allow fluids to exit the cell.

A first conduit 3036, through which an electroless deposition fluid flows, is coupled to the cell 3010. The conduit 3036 can be a hose, pipe, tube, or other fluid containing conduit. An electroless deposition fluid valve 3038 controls the flow of the electroless deposition fluid, where the valves disclosed herein can be a needle, globe, butterfly, or other type of valve and can include a valve actuator, such as a solenoid. An electroless deposition fluid container 3044 is connected to the valve 3038 that can be controlled with a controller 3040. A series of valves 3042a–f are connected to various chemical sources (not shown), where the valves 3042a–f can be separately controlled with the controller 3040. Preferably, the electroless deposition fluid is mixed on an as-needed basis in individual application quantities for deposition on the substrate 3022 and not significantly before the deposition to avoid premature electroless deposition in the conduit 3036 and associated elements. The valves 3038, 3042a–f are therefore preferably located in close proximity to the cell 3010. The first conduit 3036 connects to an first fluid inlet 3046 disposed above the substrate 3022 when the substrate is disposed in a lowered position and preferably is coupled to an articulating member 3048, such as a ball and socket joint, to allow movement of the inlet 3046 and to allow adjustment of the angle of the inlet 3046 in the cell 3010. A first nozzle 3050 is connected to the end of the inlet 3046 and is directed toward the pedestal 3018. The fluid(s) is generally delivered in a spray pattern, which may be varied depending on the particular nozzle spray pattern desired and may include a fan, jet, conical, and other patterns. Preferably, the nozzle 3050 is located outside the periphery of the substrate 3022 to allow the substrate to be raised and lowered without interference. Alternatively, the nozzle 3050 can be articulated toward the periphery of the cell 3010 with an actuator (not shown) that moves the nozzle 3050 laterally, vertically or some combination thereof to provide vertical clearance for the substrate 3022 as the substrate is raised or lowered.

Similar to the first conduit and related elements, a second conduit 3052 is disposed through the sidewall 3014. The second conduit 3052 provides a path for rinsing fluid, such as deionized water or alcohol, that is used to rinse the substrate 3022 after the electroless deposition. A second inlet 3054 is connected to the second conduit 3052 and a second nozzle 3056 is connected to the second inlet 3054. An articulating member 3059 is coupled to the second inlet 3054 and can be used to allow movement and adjustment of the angle of the inlet relative to the cell 3010. A second valve 3058 is connected to the second conduit 3052 and preferably controls the rinsing fluid timing and flow. The second conduit can also be coupled to a source of low concentration of acid or other fluids and a valve for controlling the fluid. Alternatively, the acid supply can be coupled to a separate conduit (not shown). Exemplary fluids include hydrochloric acid, sulfuric acid, phosphoric acid, hydrofluoric acid, or other liquids or fluids that can be used to coat the substrate surface after the electroless deposition to protect the layer from oxidation and other contaminants prior to the electroplating process. The substrate can thus be transferred for subsequent processing such as electroplating in a "wet" state to minimize oxidation and other contaminants. The ability to transfer in a wet state is further enhanced if the substrate is maintained in a face up position for a period of time subsequent to the electroless deposition process.

The controller 3040 preferably controls each valve and therefore each fluid timing and flow. The controller 3040 preferably also controls the substrate spin and raising and lowering of the pedestal and hence the substrate disposed thereon. The controller 3040 could be remotely located, for instance, in a control panel (not shown) or control room and the plumbing controlled with remote actuators.

In operation, a robot (not shown) delivers the substrate 3022 face up to the EDP cell 3010. The substrate 3022 already has a seed layer deposited thereon such as by PVD or IMP processing. The pedestal raises 3018 and the vacuum chuck 3026 engages the underside of the substrate 3022. The robot retracts and the pedestal 3018 lowers to a processing elevation. The controller 3040 actuates the valves 3042a–f to provide chemicals into the electroless fluid container 3044, the chemicals are mixed, and the controller actuates the electroless deposition fluid valve 3038 to open and allow a certain quantity of electroless deposition fluid into the first inlet 3046 and through the first nozzle 3050. Preferably, the pedestal 3018 spins at a relatively slow speed of about 10 to about 500 RPMs, allowing a quantity of fluid to uniformly coat the substrate 3022. The spin direction can be reversed in an alternating fashion to assist in spreading the fluid evenly across the substrate. The electroless deposition fluid valve 3038 is closed. The electroless deposition fluid autocatalytically forms a layer over the pre-deposited seed layer and joins vacancies in the prior deposited layer to provide a more complete coating even in high aspect ratio features. Preferably, the electroless deposition process deposits from about 100 Å to about 400 Å for most substrates.

The second valve 3058 opens and a rinsing fluid flows through the second conduit 3052 and is sprayed onto the substrate 3022 through the second nozzle 3056. Preferably, the pedestal 3018 rotates at a faster speed of about 100 to about 500 RPMs as the remaining electroless deposition fluid is rinsed from the substrate 3022 and is drained through the outlet 3034 and discarded. The substrate can be coated with an acid or other coating fluid. In some instances, the pedestal 3018 can spin at a higher speed of about 500 to about 2000 RPMs to spin dry the substrate 3022.

The pedestal 3018 stops rotating and raises the substrate 3022 to a position above the EDP cell 3010. The vacuum chuck 3026 releases the substrate 3022 and the robot retrieves the substrate for further processing in the electroplating cell.

Figure 6:
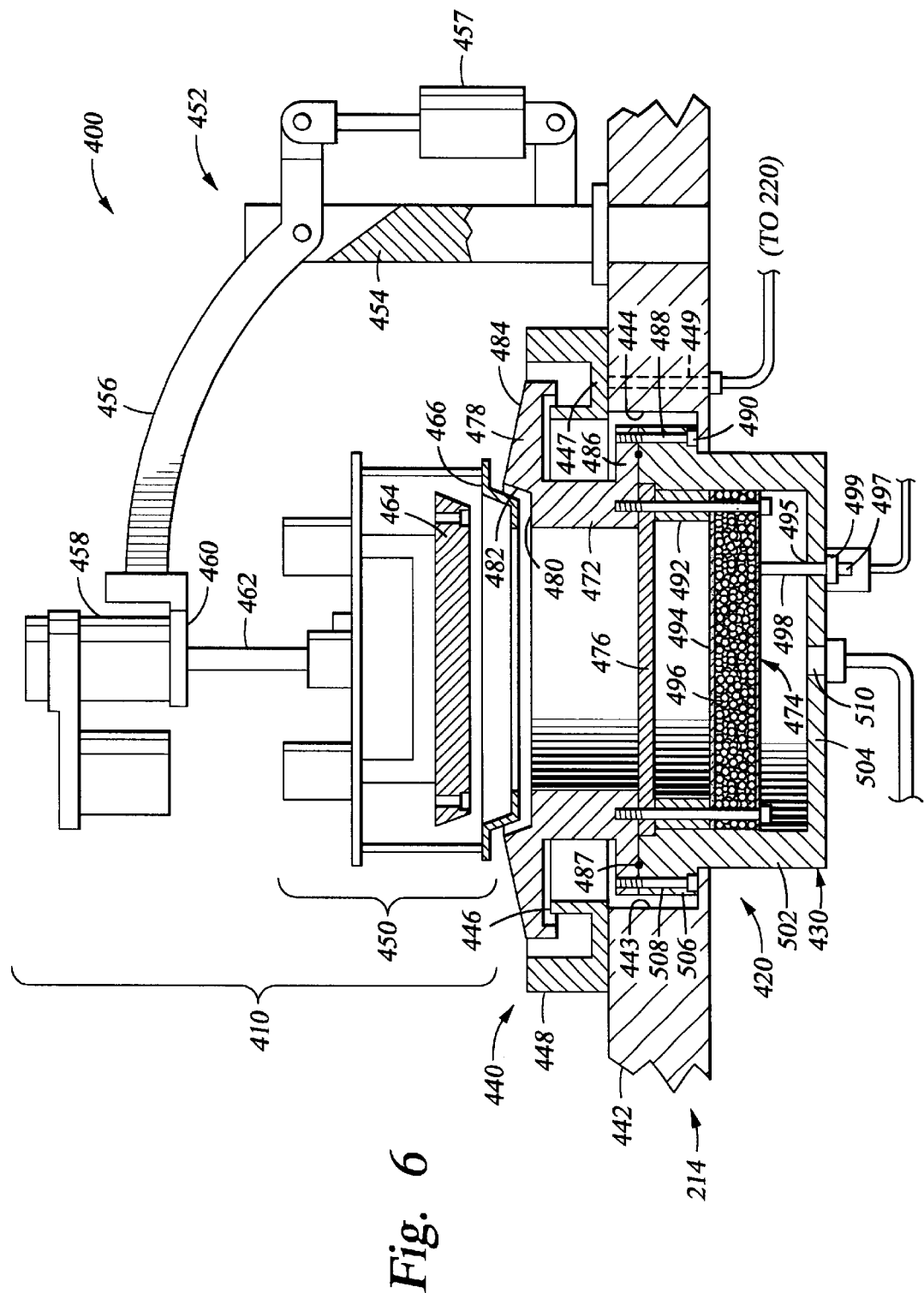
FIG. 6 is a cross sectional view of an electroplating process cell 400 according to the invention.

FIG. 6 is a cross sectional view of an electroplating process cell 400 according to the invention. The electroplating process cell 400 as shown in FIG. 6 is the same as the electroplating process cell 240 as shown in FIGS. 2 and 3. The processing cell 400 generally comprises a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220 (shown in FIG. 2) through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the wafer in the head assembly 410 in a processing position.

The head assembly 410 generally comprises a wafer holder assembly 450 and a wafer assembly actuator 458. The wafer assembly actuator 458 is mounted onto the mounting plate 460, and includes a head assembly shaft 462 extending downwardly through the mounting plate 460. The lower end of the head assembly shaft 462 is connected to the wafer holder assembly 450 to position the wafer holder assembly 450 in a processing position and in a wafer loading position.

Figure 9:
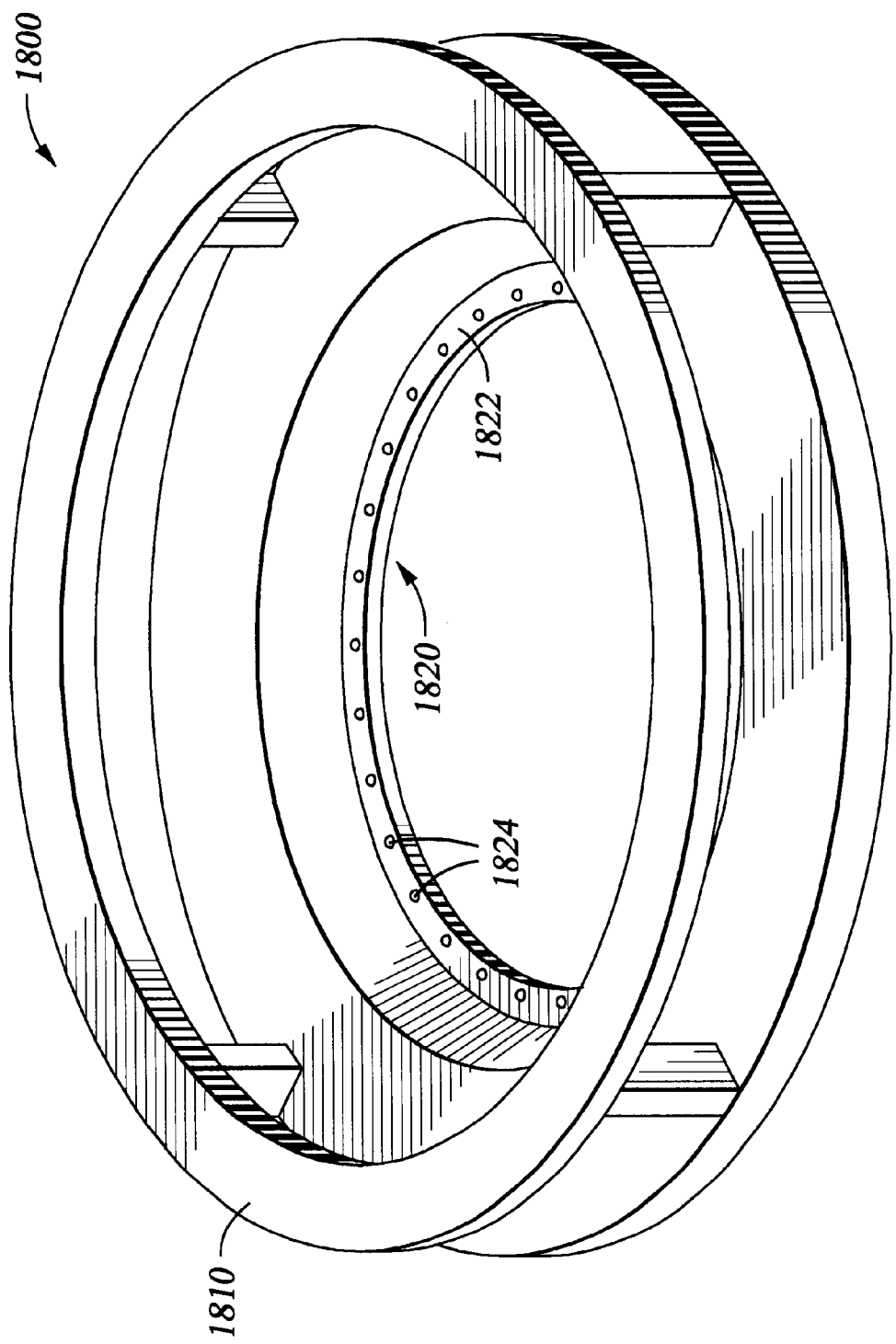
FIG. 9 is a perspective view of a cathode contact ring.

The wafer holder assembly 450 generally comprises a wafer holder 464 and a cathode contact ring 466. FIG. 9 is a perspective view of a cathode contact ring. The cathode contact ring 1800 as shown in FIG. 9 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the wafer holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electrical contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte on the surfaces of the cathode contact ring and promotes smooth dripping of the electrolyte from the cathode contact ring after the cathode contact ring is removed from the electroplating bath or electrolyte. By providing hydrophilic surfaces on the cathode contact ring that facilitate run-off of the electrolyte, plating defects caused by residual electrolyte on the cathode contact ring are significantly reduced. The inventors also contemplate application of this hydrophilic treatment or coating in other embodiments of cathode contact rings to reduce residual electrolyte beading on the cathode contact ring and the plating defects on a subsequently processed substrate that may result therefrom. Other contact ring designs are useful in the electroplating processing cell according to the invention, such as the contact ring designs described in commonly assigned and copending U.S. Patent Application Ser. No. 09/201,486 entitled "Cathode Contact Ring For Electrochemical Deposition", filed on Nov. 30, 1998, which is hereby incorporated by reference in its entirety.

Figure 10:
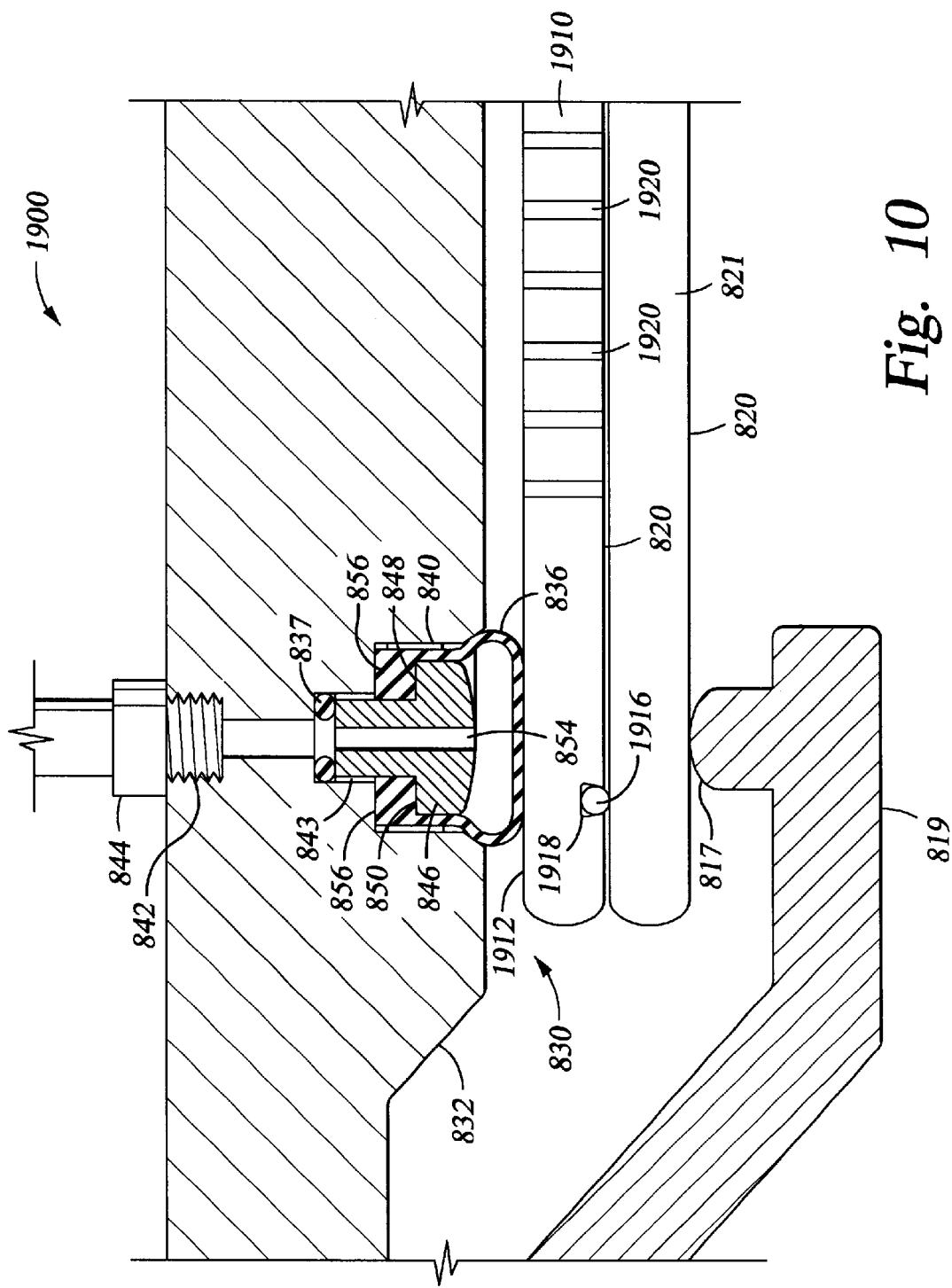
FIG. 10 is a partial cross sectional view of a wafer holder assembly.

FIG. 10 is a partial cross sectional view of a wafer holder assembly. The wafer holder 464 is preferably positioned above the cathode contact ring 466 and comprises a bladder assembly 470 that provides pressure to the backside of a wafer and ensures electrical contact between the wafer plating surface and the cathode contact ring 466. The inflatable bladder assembly 470 is disposed on a wafer holder plate 832. The bladder assembly 470 includes an inflatable bladder 836 attached to the back surface of an intermediary wafer holder plate 1910. A fluid source 838 supplies a fluid, i.e., a gas or liquid, to the bladder 836 allowing the bladder 836 to be inflated to varying degrees. Preferably, a portion of the inflatable bladder 836 is sealingly attached to the back surface 1912 of the intermediary wafer holder plate 1910 using an adhesive or other bonding material. The front surface 1914 of the intermediary wafer holder plate 1910 is adapted to receive a wafer or substrate 821 to be processed, and an elastomeric O-ring 1916 is disposed in an annular groove 1918 on the front surface 1914 of the intermediary wafer holder plate 1910 to contact a peripheral portion of the wafer back surface. The elastomeric o-ring 1916 provides a seal between the wafer back surface and the front surface of the intermediary wafer holder plate. Preferably, the intermediary wafer holder plate includes a plurality of bores or holes 1920 extending through the plate that are in fluid communication with the vacuum port (not shown) to facilitate securing the wafer on the wafer holder using a vacuum force applied to the backside of the wafer. The inflatable bladder does not directly contact a wafer being processed, and thus, the risk of cutting or damaging the inflatable bladder during wafer transfers is significantly reduced. The elastomeric O-ring 1916 is preferably coated or treated to provide a hydrophilic surface (as discussed above for the surfaces of the cathode contact ring) for contacting the wafer, and the elastomeric O-ring 1916 is replaced as needed to ensure proper contact and seal to the wafer. Other bladder are useful in the electroplating processing cell according to the invention, such as the bladder system described in commonly assigned and copending U.S. patent application Ser. No. 09/201,796 entitled "iflatable Compliant Bladder Assembly", filed on Nov. 30, 1998, which is hereby incorporated by reference in its entirety.

Figure 12:
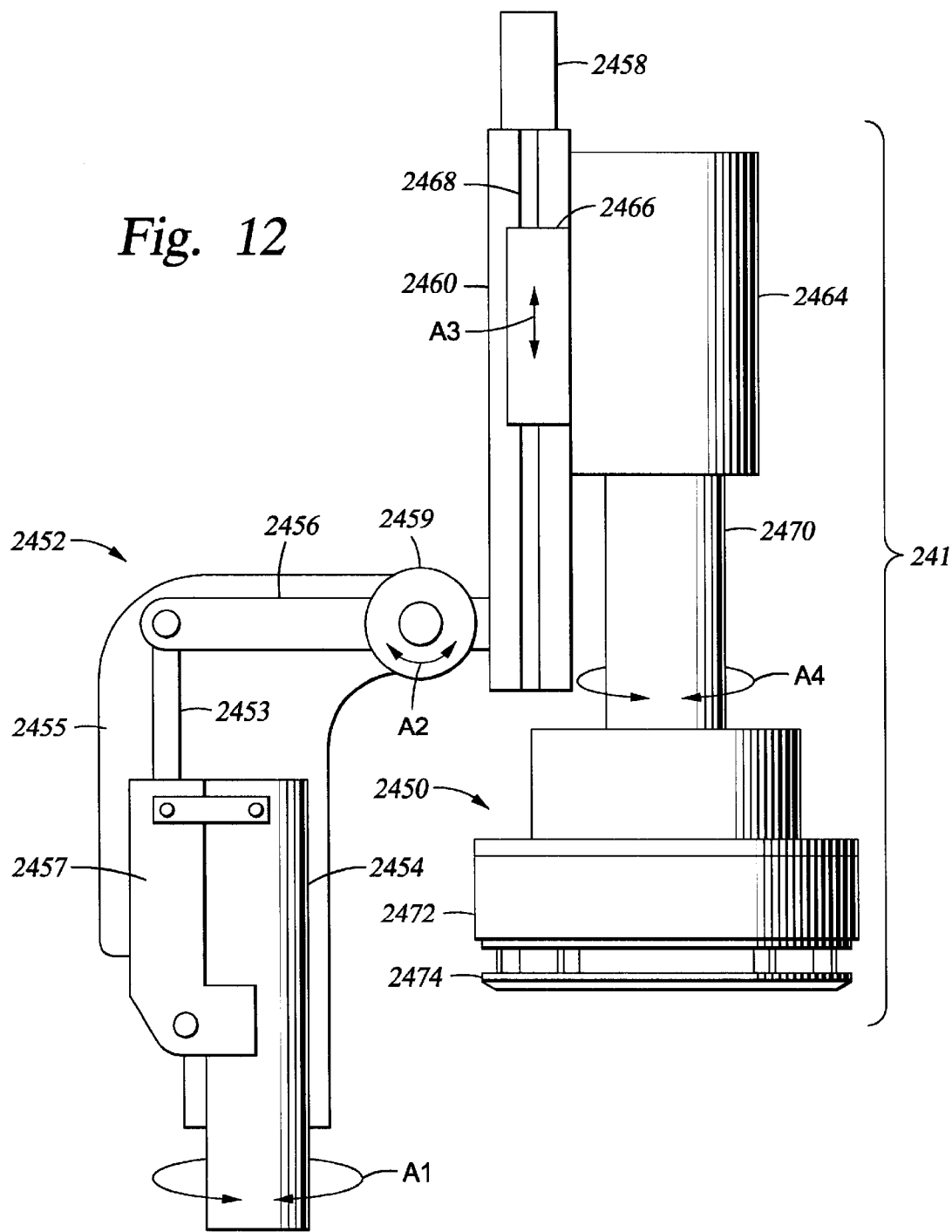
FIG. 12 is a process head assembly having a rotatable head assembly 2410.

FIG. 12 is a second embodiment of the process head assembly having a rotatable head assembly 2410. Preferably, a rotational actuator is disposed on the cantilevered arm and attached to the head assembly to rotate the head assembly during wafer processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. Preferably, the mounting post 454 provides rotational movement (as indicated by arrow A1) with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement (as indicated by arrow A2) of the cantilever arm 2456 with respect to the joint 2459 between the cantilever arm 2456 and the post cover 2454. When the cantilever arm actuator 2457 is retracted, the cantilever arm 2456 moves the head assembly 2410 away from the process kit 420 to provide the spacing required to remove and/or replace the process kit 420 from the electroplating process cell 240. When the cantilever arm actuator 2457 is extended, the cantilever arm 2456 moves the head assembly 2410 toward the process kit 420 to position the wafer in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a leadscrew type shaft that moves the lift guide (as indicated by arrows A3) between various vertical position. The rotating actuator 2464 is connected to the wafer holder assembly 2450 through the shaft 2470 and rotates the wafer holder assembly 2450 (as indicated by arrows A4). The wafer holder assembly 2450 includes a bladder assembly 2472, such as the embodiments described above with respect to FIG. 10, and a cathode contact ring 2474, such as the embodiments described above with respect to FIG. 9.

The rotation of the wafer during the electroplating process generally enhances the deposition results. Preferably, the head assembly is rotated between about 2 rpm and about 20 rpm during the electroplating process. The head assembly can also be rotated as the head assembly is lowered to position the wafer in contact with the electrolyte in the process cell as well as when the head assembly is raised to remove the wafer from the electrolyte in the process cell. The head assembly is preferably rotated at a high speed (i.e., >20 rpm) after the head assembly is lifted from the process cell to enhance removal of residual electrolyte on the head assembly.

In one embodiment, the inventors have improved the uniformity of the deposited film to within about 2% (i.e., maximum deviation of deposited film thickness is at about 2% of the average film thickness) while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the electrolyte chemistry, electrolyte flow and other parameters.

Referring back to FIG. 6, a cross sectional view of an electroplating process cell 400, the wafer holder assembly 450 is positioned above the process kit 420. The process kit 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, plexiglass (acrylic), lexane, PVC, CPVC, and PVDF. Alternatively, the container body 472 can be made from a metal, such as stainless steel, nickel and titanium, which is coated with an insulating layer, such as TeflonTM, PVDF, plastic, rubber and other combinations of materials that do not dissolve in the electrolyte and can be electrically insulated from the electrodes (i.e., the anode and cathode of the electroplating system). The container body 472 is preferably sized and adapted to conform to the wafer plating surface and the shape of the of a wafer being processed through the system, typically circular or rectangular in shape. One preferred embodiment of the container body 472 comprises a cylindrical ceramic tube having an inner diameter that has about the same dimension as or slightly larger than the wafer diameter. The inventors have discovered that the rotational movement typically required in typical electroplating systems is not required to achieve uniform plating results when the size of the container body conforms to about the size of the wafer plating surface.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a wafer is positioned in the processing position, the wafer plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte collector 440 to allow removal and replacement of the process kit 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nuts/bolts combination facilitates fast and easy removal and replacement of the components of the process kit 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430. The filter 476 preferably comprises a ceramic diffluser that also serves to control the electrolyte flow pattern toward the substrate plating surface.

The anode assembly 474 preferably comprises a consumable anode that serves as a metal source in the electrolyte. Alternatively, the anode assembly 474 comprises a nonconsumable anode, and the metal to be electroplated is supplied within the electrolyte from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electro-chemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable (i.e., soluble) anode provides gas-generation-free electrolyte and minimizes the need to constantly replenish the metal in the electrolyte.

An anode electrode contact 498 is inserted through the anode enclosure 494 to provide electrical connection to the soluble metal 496 from a power supply. Preferably, the anode electrode contact 498 is made from a conductive material that is insoluble in the electrolyte, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension (i.e., circumference) of the upper annular flange 506 is about the same as the outer dimension (ie., circumference) of the lower annular flange 486. Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 11:
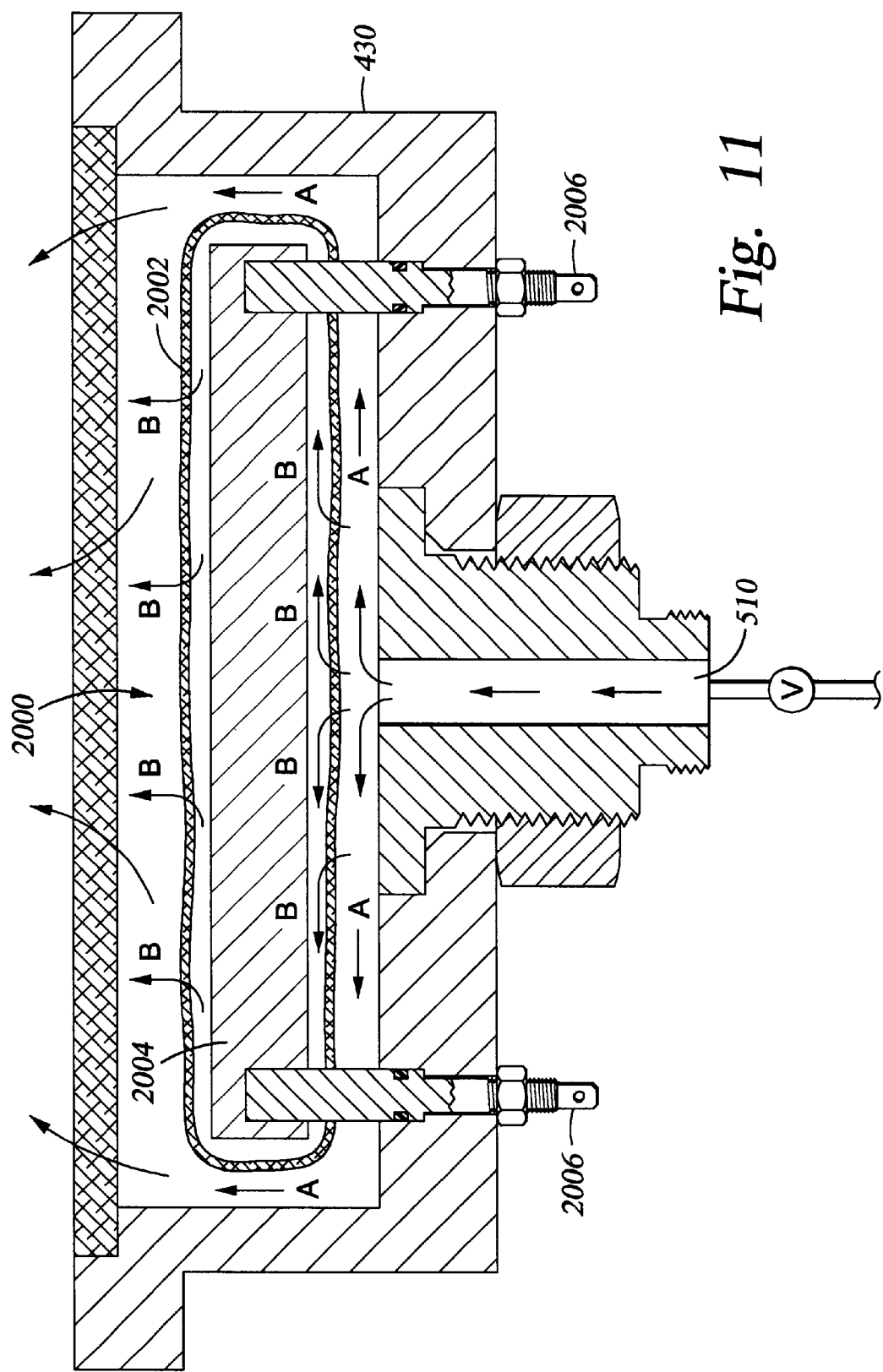
FIG. 11 is a cross sectional view of an encapsulated anode.

FIG. 11 is a cross sectional view of an encapsulated anode. The encapsulated anode 2000 includes a permeable anode enclosure that filters or traps "anode sludge" or particulates generated as the metal is dissolved from the anode plate 2004. As shown in FIG. 11, the consumable anode plate 2004 comprises a solid piece of copper, preferably, high purity, oxygen free copper, enclosed in a hydrophilic anode encapsulation membrane 2002. The anode plate 2004 is secured and supported by a plurality of electrical contacts or feed-throughs 2006 that extend through the bottom of the bowl 430. The electrical contacts or feed-throughs 2006 extend through the anode encapsulation membrane 2002 into the bottom surface of the anode plate 2004. The flow of the electrolyte is indicated by the arrows A from the electrolyte inlet 510 disposed at the the bottom of the bowl 430 through the gap between the anode and the bowl sidewall. The electrolyte also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 $\mu$m and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford, Mass. As the electrolyte flows through the encapsulation membrane, anode sludge and particulates generated by the dissolving anode are filtered or trapped by the encapsulation membrane. Thus, the encapsulation membranes improve the purity of the electrolyte during the electroplating process, and defect formations on the substrate during the electroplating process caused by anode sludge and contaminant particulates are significantly reduced. Other anode designs are useful in the electroplating processing cell according to the invention, such as the anode designs described in commonly assigned and copending U.S. patent application Ser. No. 09/289,074, entitled "Electro-Chemical Deposition System", filed on Apr. 8, 1999, which is hereby incorporated by reference in its entirety.

Figure 7:
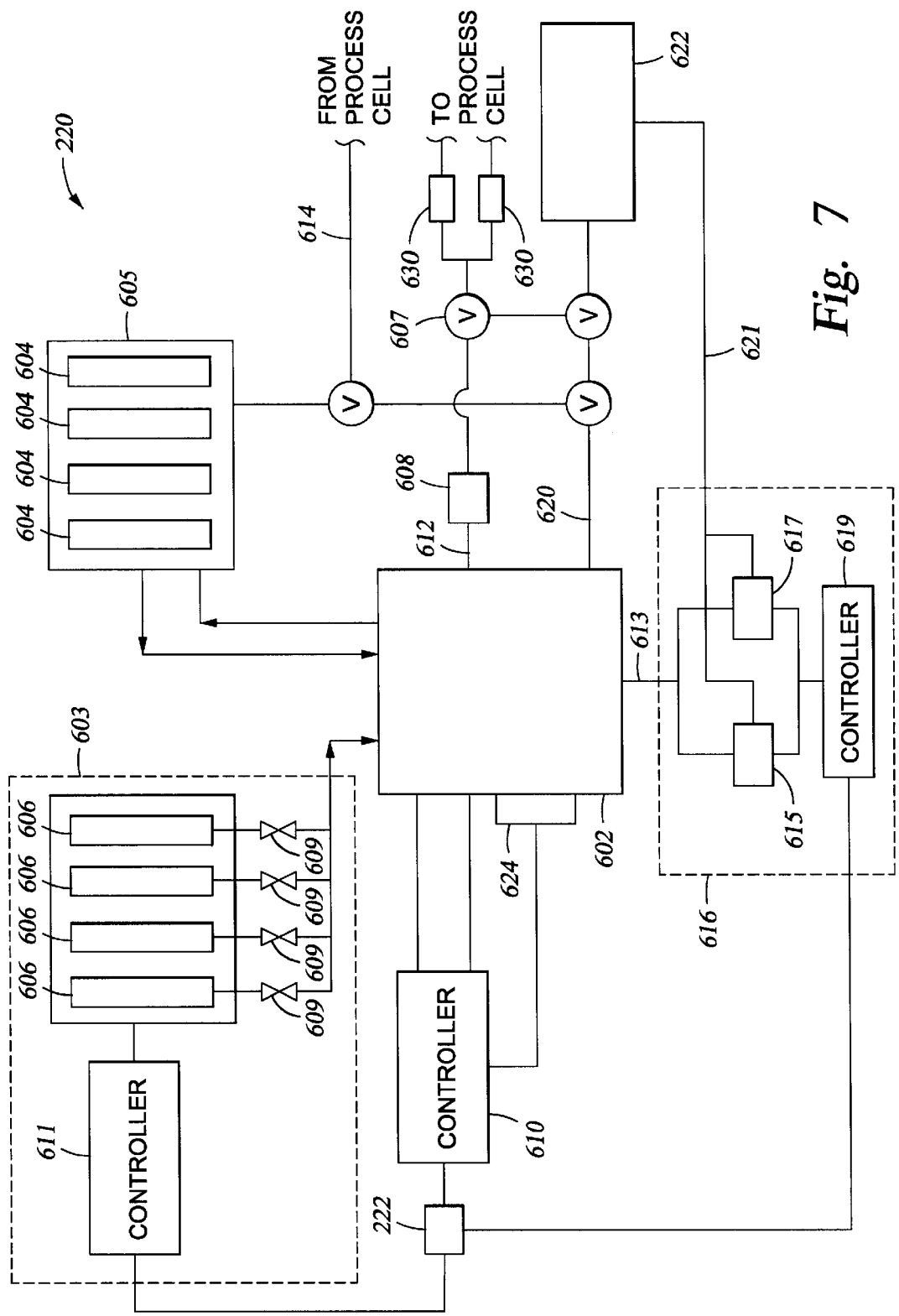
FIG. 7 is a schematic diagram of an electrolyte replenishing system 220.

FIG. 7 is a schematic diagram of an electrolyte replenishing system 220. The electrolyte replenishing system 220 provides the electrolyte to the electroplating process cells for the electroplating process. The electrolyte replenishing system 220 generally comprises a main electrolyte tank 602, a dosing module 603, a filtration module 605, a chemical analyzer module 616, and an electrolyte waste disposal system 622 connected to the analyzing module 616 by an electrolyte waste drain 620. One or more controllers control the composition of the electrolyte in the main tank 602 and the operation of the electrolyte replenishing system 220. Preferably, the controllers are independently operable but integrated with the control system 222 of the electroplating system platform 200.

The main electrolyte tank 602 provides a reservoir for electrolyte and includes an electrolyte supply line 612 that is connected to each of the electroplating process cells through one or more fluid pumps 608 and valves 607. A heat exchanger 624 or a heater/chiller disposed in thermal connection with the main tank 602 controls the temperature of the electrolyte stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte and typically include a deionized water source tank and copper sulfate ($CuSO_4$) source tank for composing the electrolyte. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the system control 222 to receive signals therefrom.

The electrolyte filtration module 605 includes a plurality of filter tanks 604. An electrolyte return line 614 is connected between each of the process cells and one or more filter tanks 604. The filter tanks 604 remove the undesired contents in the used electrolyte before returning the electrolyte to the main tank 602 for re-use. The main tank 602 is also connected to the filter tanks 604 to facilitate re-circulation and filtration of the electrolyte in the main tank 602. By re-circulating the electrolyte from the main tank 602 through the filter tanks 604, the undesired contents in the electrolyte are continuously removed by the filter tanks 604 to maintain a consistent level of purity. Additionally, re-circulating the electrolyte between the main tank 602 and the filtration module 605 allows the various chemicals in the electrolyte to be thoroughly mixed.

The electrolyte replenishing system 220 also includes a chemical analyzer module 616 that provides real-time chemical analysis of the chemical composition of the electrolyte. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte. For example, while a first analyzer may be used to monitor the concentrations of organic substances, a second analyzer is needed for inorganic chemicals. In the specific embodiment shown in FIG. 7 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte and by-products resulting from the processing which are returned to the main tank 602 from the process cells.

Preferably, the analyzers include standards and calibration schemes that facilitates the controller to compensate for the drifts in measurements as the electrodes or sensors in the analyzers become corroded due to repeated use. The standards and calibration schemes are preferably grouped according to the substances being analyzed by the analyzer. For example, the auto titration analyzer 615 includes standards and calibration schemes for the inorganic substances, and the CVS 617 includes standards and calibration schemes for the organic substances. For example, as shown in Table 1, three standards are provided for an analysis of copper and chloride contents in the electrolyte.

TABLE 1

Standards for copper and chloride contents

|  | Copper | Chloride |
| --- | --- | --- |
| Standard 1 (low) | 40 g/l | 40 ppm |
| Standard 2 (medium) | 50 g/l | 70 ppm |
| Standard 3 (high) | 60 g/l | 100 ppm |

The analyzer uses the standards to determine the deviation or measurement drift of the electrode or sensor as the electrode or sensor for the analyzer for the copper and chloride contents becomes corroded with repeated use. By interpolating a linear relationship between the known contents in the standards and the measurement by the analyzer, the analyzer becomes calibrated to provide accurate analysis of the substances in the electrolyte sample. The measured data from the electrolyte sample is compensated for the measurement drifts of the electrodes or sensors to provide accurate measurements. By using standards and calibration schemes, the invention provides accurate real-time, on-line analysis of the electrolyte and facilitates a closed-loop analysis that can be performed with an analyzer attached to the system. The invention also extends the useful life of the electrodes or sensors and decreases the frequency of system interruptions due to replacement of these components.

The analyzer module shown FIG. 7 is merely illustrative. In another embodiment each analyzer may be coupled to the main electrolyte tank by a separate supply line and be operated by separate controllers. Persons skilled in the art will recognize other embodiments.

In operation, a sample of electrolyte is flowed to the analyzer module 616 via the sample line 613. Although the sample may be taken periodically, preferably a continuous flow of electrolyte is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the control system 222. The control system 222 processes the information and transmits signals which include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte throughout the electroplating process. The waste electrolyte from the analyzer module is then flowed to the waste disposal system 622 via the outlet line 621.

Although a preferred embodiment utilizes real-time monitoring and adjustments of the electrolyte, various alternatives may be employed according to the present invention. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 7, a single controller may be used to operate various components of the system such as the chemical analyzer module 616, the dosing module 603, and the heat exchanger 624. Other embodiments will be apparent to those skilled in the art.

The electrolyte replenishing system 220 also includes an electrolyte waste drain 620 connected to an electrolyte waste disposal system 622 for safe disposal of used electrolytes, chemicals and other fluids used in the electroplating system. Preferably, the electroplating cells include a direct line connection to the electrolyte waste drain 620 or the electrolyte waste disposal system 622 to drain the electroplating cells without returning the electrolyte through the electrolyte replenishing system 220. The electrolyte replenishing system 220 preferably also includes a bleed off connection to bleed off excess electrolyte to the electrolyte waste drain 620.

Preferably, the electrolyte replenishing system 220 also includes one or more degasser modules 630 adapted to remove undesirable gases from the electrolyte. The degasser module generally comprises a membrane that separates gases from the fluid passing through the degasser module and a vacuum system for removing the released gases. The degasser modules 630 are preferably placed in line on the electrolyte supply line 612 adjacent to the process cells 240. The degasser modules 630 are preferably positioned as close as possible to the process cells 240 so that most of the gases from the electrolyte replenishing system are removed by the degasser modules before the electrolyte enters the process cells. Preferably, each degasser module 630 includes two outlets to supply degassed electrolyte to the two process cells 240 of each processing station 218. Alternatively, a degasser module 630 is provided for each process cell. The degasser modules can be placed at many other alternative positions. For example, the degasser module can be placed at other positions in the electrolyte replenishing system, such as along with the filter section or in a closed-loop system with the main tank or with the processing cell. As another example, one degasser module is placed in line with the electrolyte supply line 612 to provide degassed electrolyte to all of the process cells 240 of the electrochemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to be oxidized by the rinsing process. Degasser modules are well known in the art and commercial embodiments are generally available and adaptable for use in a variety of applications. A commercially available degasser module is available from Millipore Corporation, located in Bedford, Massachusettes.

Figure 13A:
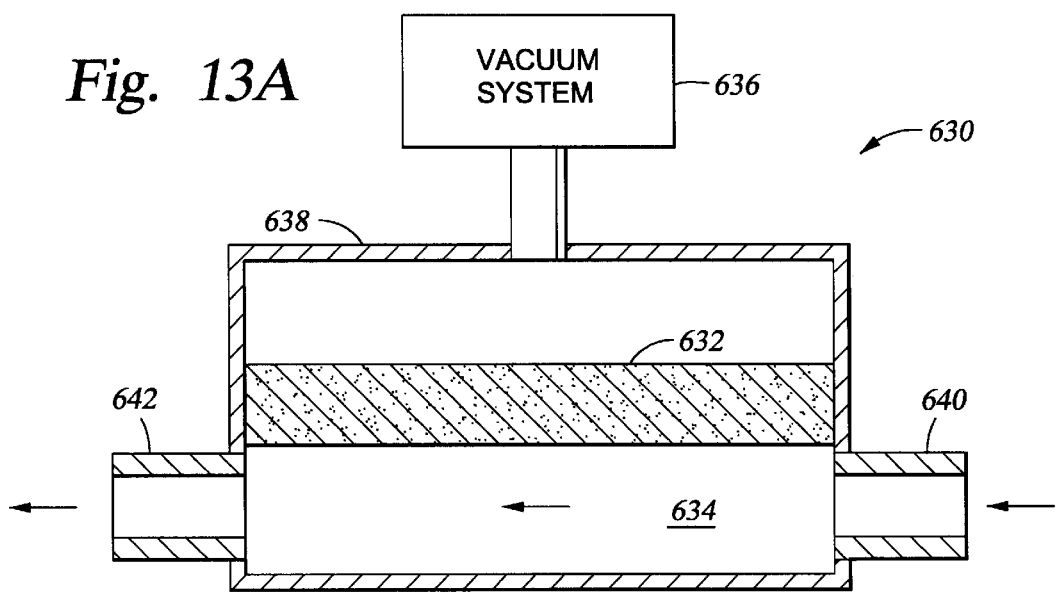
FIGS. 13a and 13b are cross sectional views of embodiments of a degasser module.
Figure 13B:
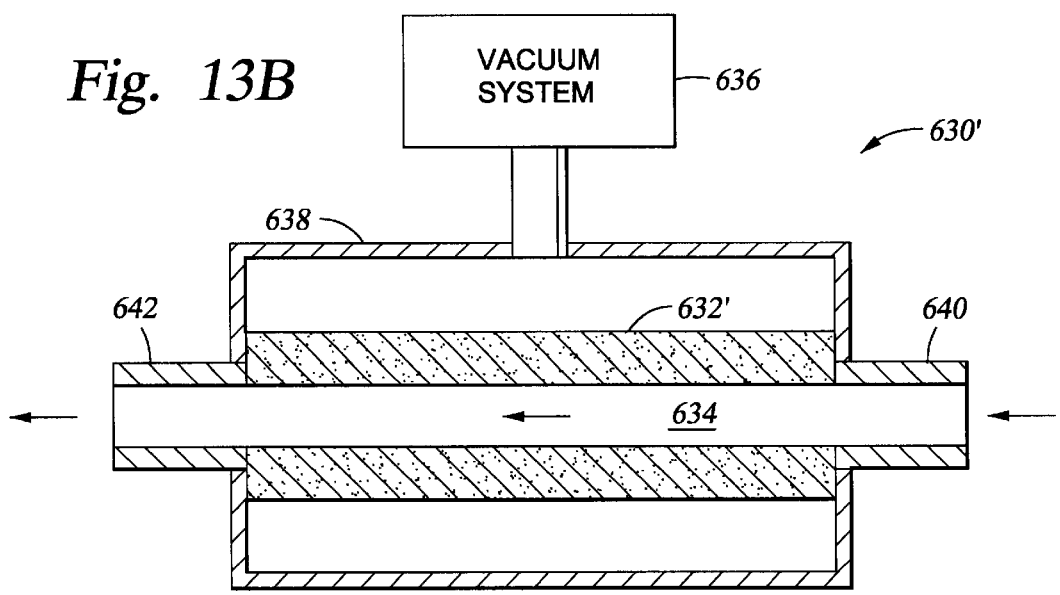

One embodiment of the degasser module 630, as shown in FIG. 13a, includes a hydrophobic membrane 632 having a fluid (i.e., electrolyte) passage 634 on one side of the membrane 632 and a vacuum system 636 disposed on the opposite side of the membrane. The enclosure 638 of the degasser module includes an inlet 640 and one or more outlets 642. As the electrolyte passes through the degasser module 630, the gases and other micro-bubbles in the electrolyte are separated from the electrolyte through the hydrophobic membrane and removed by the vacuum system. Another embodiment of the degasser module 630', as shown in FIG. 13b, includes a tube of hydrophobic membrane 632' and a vacuum system 636 disposed around the tube of hydrophobic membrane 632'. The electrolyte is introduced inside the tube of hydrophobic membrane, and as the electrolyte passes through the fluid passage 634 in the tube, gases and other micro-bubbles in the electrolyte are separated from the electrolyte through the tube of hydrophobic membrane 632' and removed by the vacuum system 636 surrounding the tube. More complex designs of degasser modules are contemplated by the invention, including designs having serpentine paths of the electrolyte across the membrane and other multi-sectioned designs of degasser modules.

Although not shown in FIG. 7, the electrolyte replenishing system 220 may include a number of other components. For example, the electrolyte replenishing system 220 preferably also includes one or more additional tanks for storage of chemicals for a wafer cleaning system, such as the SRD station. Double-contained piping for hazardous material connections may also be employed to provide safe transport of the chemicals throughout the system. Optionally, the electrolyte replenishing system 220 includes connections to additional or external electrolyte processing system to provide additional electrolyte supplies to the electroplating system.

Figure 8:
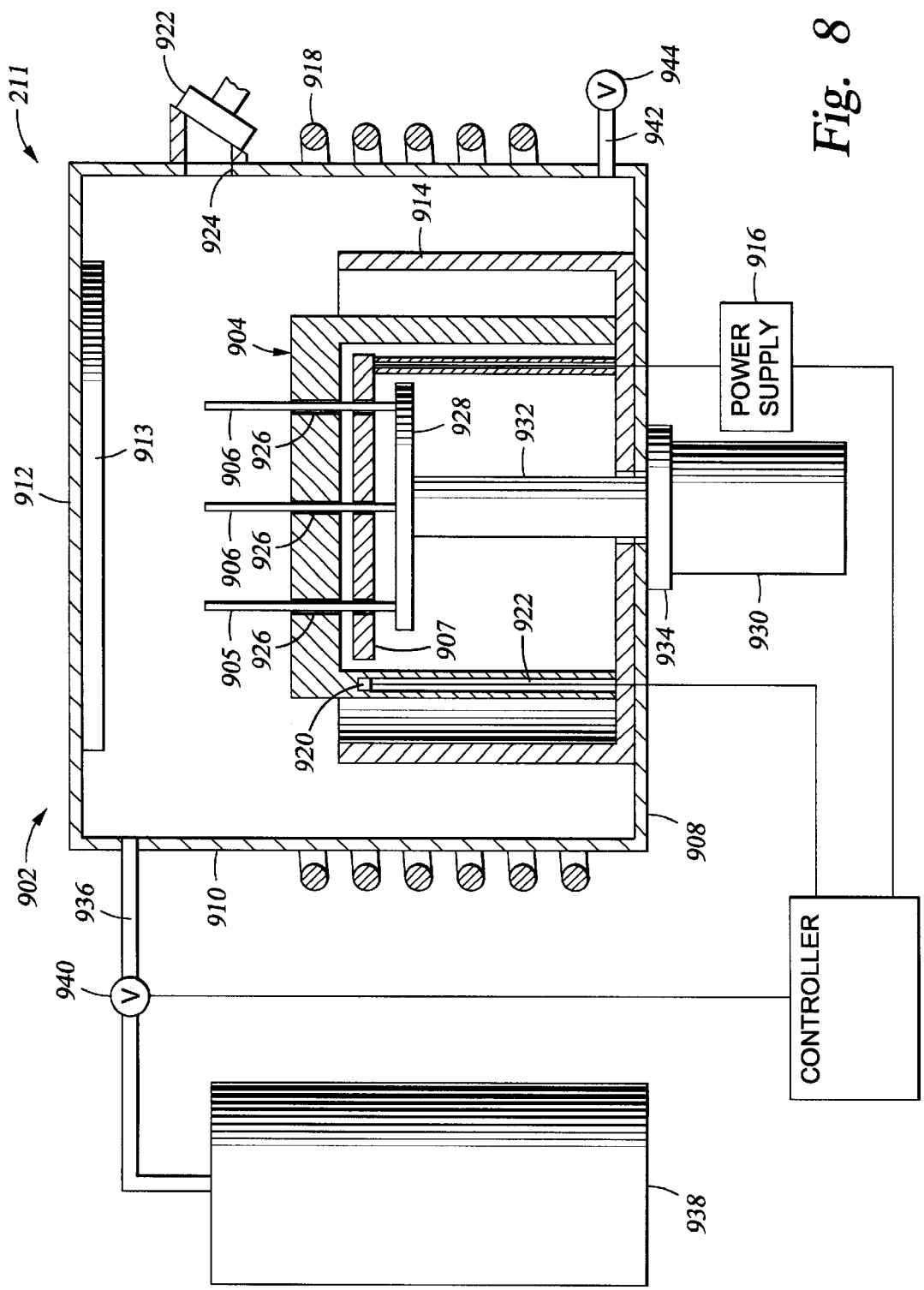
FIG. 8 is a cross sectional view of a rapid thermal anneal chamber.

FIG. 8 is a cross sectional view of a rapid thermal anneal chamber according to the invention. The rapid thermal anneal (RTA) chamber 211 is preferably connected to the loading station 210, and substrates are transferred into and out of the RTA chamber 211 by the loading station transfer robot 228. The electroplating system, as shown in FIGS. 2 and 3, preferably comprises two RTA chambers 211 disposed on opposing sides of the loading station 210, corresponding to the symmetric design of the loading station 210. Thermal anneal process chambers are generally well known in the art, and rapid thermal anneal chambers are typically utilized in substrate processing systems to enhance the properties of the deposited materials. The invention contemplates utilizing a variety of thermal anneal chamber designs, including hot plate designs and heat lamp designs, to enhance the electroplating results. One particular thermal anneal chamber useful for the present invention is the WxZ chamber available from Applied materials, Inc., located in Santa Clara, Calif. Although the invention is described using a hot plate rapid thermal anneal chamber, the invention contemplates application of other thermal anneal chambers as well.

The RTA chamber 211 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures (ie., greater than about 500° C.), and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA chamber 211 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller (ie., the system controller described below) and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels (not shown) are formed within the sidewall 910 to control the temperature of the enclosure 902. The cold plate 913 disposed on the inside surface of the top 912 cools a substrate that is positioned in close proximity to the cold plate 913.

The RTA chamber 211 includes a slit valve 922 disposed on the sidewall 910 of the enclosure 902 for facilitating transfers of substrates into and out of the RTA chamber. The slit valve 922 selectively seals an opening 924 on the sidewall 910 of the enclosure that communicates with the loading station 210. The loading station transfer robot 228 (see FIG. 2) transfers substrates into and out of the RTA chamber through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 211, the slit valve 922 is opened, and the loading station transfer robot 228 extends its robot blade having a substrate positioned thereon through the opening 924 into the RTA chamber. The robot blade of the loading station transfer robot 228 positions the substrate in the RTA chamber above the heater plate 904, and the substrate support pins 906 are extended upwards to lift the substrate above the robot blade. The robot blade then retracts out of the RTA chamber, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA chamber 211 during the anneal treatment process. The gas inlet 936 is connected to a gas source 938 through a valve 940 for controlling the flow of the gas into the RTA chamber 211. A gas outlet 942 is preferably disposed at a lower portion of the sidewall 910 of the enclosure 902 to exhaust the gases in the RTA chamber and is preferably connected to a relief/check valve 944 to prevent backstreaming of atmosphere from outside of the chamber. Optionally, the gas outlet 942 is connected to a vacuum pump (not shown) to exhaust the RTA chamber to a desired vacuum level during an anneal treatment.

According to the invention, a substrate is annealed in the RTA chamber 211 after the substrate has been electroplated in the electroplating cell and cleaned in the SRD station. Preferably, the RTA chamber 211 is maintained at about atmospheric pressure, and the oxygen content inside the RTA chamber 211 is controlled to less than about 100 ppm during the anneal treatment process. Preferably, the ambient environment inside the RTA chamber 211 comprises nitrogen ($N_2$) or a combination of nitrogen ($N_2$) and less than about 4% hydrogen ($H_2$), and the ambient gas flow into the RTA chamber 211 is maintained at greater than 20 liters/min to control the oxygen content to less than 100 ppm. The electroplated substrate is preferably annealed at a temperature between about 200° C. and about 450° C. for between about 30 seconds and 30 minutes, and more preferably, between about 250° C. and about 400° C. for between about 1 minute and 5 minutes. Rapid thermal anneal processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm (i.e., contacting the heater plate) and about 20 mm from the heater plate for the duration of the anneal treatment process. Preferably, a control system 222 controls the operation of the RTA chamber 211, including maintaining the desired ambient environment in the RTA chamber and the temperature of the heater plate.

After the anneal treatment process is completed, the substrate support pins 906 lift the substrate to a position for transfer out of the RTA chamber 211. The slit valve 922 opens, and the robot blade of the loading station transfer robot 228 is extended into the RTA chamber and positioned below the substrate. The substrate support pins 906 retract to lower the substrate onto the robot blade, and the robot blade then retracts out of the RTA chamber. The loading station transfer robot 228 then transfers the processed substrate into the cassette 232 for removal out of the electroplating processing system. (see FIGS. 2 and 3).

Referring back to FIG. 2, the electroplating system platform 200 includes a control system 222 that controls the functions of each component of the platform. Preferably, the control system 222 is mounted above the mainframe 214 and comprises a programmable microprocessor. The programmable microprocessor is typically programmed using a software designed specifically for controlling all components of the electroplating system platform 200. The control system 222 also provides electrical power to the components of the system and includes a control panel 223 that allows an operator to monitor and operate the electroplating system platform 200. The control panel 223, as shown in FIG. 2, is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the controller of the electrolyte replenishing system 220 to provide the electrolyte for the electroplating process.

The following is a description of a typical wafer electroplating process sequence through the electroplating system platform 200 as shown in FIG. 2. The process sequence described below is exemplary of various other process sequence or combination that can be performed utilizing the electro-chemical deposition system according to the invention. A wafer cassette containing a plurality of wafers is loaded into the wafer cassette receiving areas 224 in the loading station 210 of the electroplating system platform 200. A loading station transfer robot 228 picks up a wafer from a wafer slot in the wafer cassette and places the wafer in the wafer orientor 230. The wafer orientor 230 determines and orients the wafer to a desired orientation for processing through the system. The loading station transfer robot 228 then transfers the oriented wafer from the wafer orientor 230 and positions the wafer in one of the wafer slots in the wafer pass-through cassette 238 in the SRD station 212. The mainframe transfer robot 242 picks up the wafer from the wafer pass-through cassette 238 and secures the wafer on the flipper robot end effector. The mainframe transfer robot 242 transfers the wafer to the EDP cell 3010, and a seed layer repair process is performed utilizing electroless deposition.

After the seed layer repair process, the mainframe transfer robot transfers the wafer to the processing cell 240 for the electroplating process. The flipper robot end effector 2404 rotates and positions the wafer face down in the wafer holder assembly 450. The wafer is positioned below the wafer holder 464 but above the cathode contact ring 466. The flipper robot end effector 2404 then releases the wafer to position the wafer into the cathode contact ring 466. The wafer holder 464 moves toward the wafer and the vacuum chuck secures the wafer on the wafer holder 464. The bladder assembly 470 on the wafer holder assembly 450 exerts pressure against the wafer backside to ensure electrical contact between the wafer plating surface and the cathode contact ring 466.

The head assembly 452 is lowered to a processing position above the process kit 420. At this position the wafer is below the upper plane of the weir 478 and contacts the electrolyte contained in the process kit 420. The power supply is activated to supply electrical power (ie., voltage and current) to the cathode and the anode to enable the electroplating process. The electrolyte is typically continually pumped into the process kit during the electroplating process. The electrical power supplied to the cathode and the anode and the flow of the electrolyte are controlled by the control system 222 to achieve the desired electroplating results. Preferably, the head assembly is rotated as the head assembly is lowered and also during the electroplating process.

After the electroplating process has been completed, the head assembly 410 raises the wafer holder assembly and removes the wafer from the electrolyte. Preferably, the head assembly is rotated for a period of time to enhance removal of residual electrolyte from the wafer holder assembly. The vacuum chuck and the bladder assembly of the wafer holder then release the wafer from the wafer holder, and the wafer holder is raised to allow the flipper robot end effector 2404 to pick up the processed wafer from the cathode contact ring. The flipper robot end effector 2404 is moved to a position above the backside of the processed wafer in the cathode contact ring and picks up the wafer using the vacuum suction gripper on the flipper robot end effector. The mainframe transfer robot retracts the flipper robot end effector with the wafer out of the processing cell 240 and the flipper robot end effector flips the wafer from a face-down position to a face-up position.

The wafer is then transferred into the EBR/SRD module 2200. The EBR/SRD wafer support lifts the wafer, and the mainframe transfer robot retracts out of the EBR/SRD module 2200. The wafer is positioned onto the vacuum wafer holder in the EBR/SRD cell, and an edge bead removal process is performed, as described in detail above, to remove excess deposition at the edge portion of the wafer. The wafer is then cleaned using a spin-rinse-dry process in the EBR/SRD module using deionized water or a combination of deionized water and a cleaning fluid as described in detail above. The wafer is then positioned for transfer out of the EBR/SRD module.

The loading station transfer robot 228 picks up the wafer from the EBR/SRD module 2200 and transfers the processed wafer into the RTA chamber 211 for an anneal treatment process to enhance the properties of the deposited materials. The annealed wafer is then transferred out of the RTA chamber 211 by the loading station robot 228 and placed back into the wafer cassette for removal from the electroplating system. The above-described sequence can be carried out for a plurality of wafers substantially simultaneously in the electroplating system platform 200 of the present invention. Also, the electroplating system according to the invention can be adapted to provide multi-stack wafer processing.

While the foregoing is directed to the preferred embodiment of the present invention, other and further embodiments of the invention may be devised without departing from the basic scope thereof. The scope of the invention is determined by the claims which follow.

What is claimed is:

1. An electro-chemical deposition system, comprising:

a) a mainframe having a mainframe wafer transfer robot;

b) a loading station disposed in connection with the mainframe;

c) one or more processing cells disposed in connection with the mainframe;

d) an electrolyte supple fluidly connected to the one or more processing cells; and e) a seed layer repair station disposed on the mainframe.

2. The system of claim 1 wherein the seed layer repair station comprises an electroless deposition cell.

3. The system of claim 1, further comprising:

a system controller for controlling an electrochemical deposition process.

4. The system of claim 3, further comprising:

an edge bead removal/spin-rinse-dry (EBR/SRD) station disposed on the main frame adjacent the loading station.

5. The system of claim 4, further comprising:

a thermal anneal chamber disposed in connection with the loading station.

6. The system of claim 1 wherein the mainframe includes a base having a protective coating.

7. The system of claim 6 wherein the coating comprises ethylene-chloro-tri-fluoro-ethaylene (ECTFE).

8. An electrochemical deposition system, comprising:
   a) a mainframe having a mainframe wafer transfer robot;
   b) a loading station disposed in connection with the mainframe;
   c) one or more processing cells disposed in connection with the mainframe; and
   d) an electrolyte supply fluidly connected to the one or more processing cells, wherein the electrolyte supply comprises:
      i) a main tank connected through a pump to the processing cells;
      ii) one or more filter tanks connected to the main tank; and
      iii) one or more source tanks connected to the main tank.

9. The system of claim 8, further comprising an analyzer disposed in a closed loop system with the electrolyte supply.

10. The system of claim 9 wherein the analyzer includes one or more standards and one or more calibration schemes.

* * * * *

UNITED STATES PATENT AND TRADEMARK OFFICE
CERTIFICATE OF CORRECTION

PATENT NO. : 6,267,853 B1
DATED : July 31, 2001
INVENTOR(S) : Dordi et al.

It is certified that error appears in the above-identified patent and that said Letters Patent is hereby corrected as shown below:

Title page,
In the inventor names, please replace "Timothy H. Franklin" with -- Timothy J. Franklin --.

OTHER PUBLICATIONS, please replace "PCT/US99/28159" with -- PCT/US 99/28159 --.

Column 3,
Line 24, please replace "electrochemical" with -- electro-chemical --.
Line 35, please replace "include" with -- to include --.
Line 45, please replace "electrochemical" with -- electro-chemical --.
Line 61, please replace "electrochemical" with -- electro-chemical --.
Line 62, please replace "electrochemical" with -- electro-chemical --.

Column 5,
Line 2, please replace "(EBRISRD)" with -- (EBR/SRD) --.

Column 11,
Line 7, please replace "ie." with -- i.e. --.
Line 30, please replace "ie." with -- i.e. --.
Line 38, please replace "EBRISRD" with -- EBR/SRD --.

Column 13,
Line 7, please replace "an" with -- a --.

Column 16,
Line 28, please replace "bladder" with -- bladders --.
Line 31, please replace "iflatable" with -- Inflatable --.

Column 17,
Line 59, please replace " TeflonTM" with -- Teflon$^{TM}$ --.
Line 65, please replace "of the of a" with -- of the --.

Column 19,
Line 33, please replace "ie." with -- i.e. --.

Column 20,
Line 22, please replace "at the the" with -- at the --.

UNITED STATES PATENT AND TRADEMARK OFFICE
CERTIFICATE OF CORRECTION

PATENT NO.   : 6,267,853 B1
DATED        : July 31, 2001
INVENTOR(S)  : Dordi et al.

It is certified that error appears in the above-identified patent and that said Letters Patent is hereby corrected as shown below:

Column 22,
Line 43, please replace "shown" with -- shown in --.

Column 24,
Line 65, please replace "ie." with -- i.e. --.

Column 25,
Line 15, please replace "ie." with -- i.e. --.
Line 45, please replace "to an to an" with -- to an --.

Column 27,
Line 44, please replace "ie." with -- i.e. --.

Column 28,
Line 49, please replace "supple" with -- supply --.
Line 55, please replace "electrochemical" with -- electro-chemical --.
Line 61, please replace "main frame" with -- mainframe --.

Signed and Sealed this

Twenty-sixth Day of February, 2002

Attest:

JAMES E. ROGAN
Attesting Officer    Director of the United States Patent and Trademark Office